US011881502B2

(12) United States Patent
Kim et al.

(10) Patent No.: US 11,881,502 B2
(45) Date of Patent: Jan. 23, 2024

(54) SEMICONDUCTOR DEVICE HAVING SUPPORTER PATTERN

(71) Applicant: Samsung Electronics Co., Ltd., Suwon-si (KR)

(72) Inventors: Seung Jin Kim, Hwaseong-si (KR); Sung Soo Yim, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 17/489,961

(22) Filed: Sep. 30, 2021

(65) Prior Publication Data

US 2022/0020845 A1    Jan. 20, 2022

Related U.S. Application Data

(63) Continuation of application No. 16/556,786, filed on Aug. 30, 2019, now Pat. No. 11,245,001.

(30) Foreign Application Priority Data

Mar. 21, 2019    (KR) .................. 10-2019-0032331

(51) Int. Cl.
*H01L 27/108*    (2006.01)
*H01L 49/02*    (2006.01)
*H10B 12/00*    (2023.01)

(52) U.S. Cl.
CPC ........... *H01L 28/90* (2013.01); *H10B 12/033* (2023.02); *H10B 12/315* (2023.02)

(58) Field of Classification Search
CPC ............... H01L 27/10852; H01L 28/90; H01L 27/10814
See application file for complete search history.

(56) References Cited

U.S. PATENT DOCUMENTS

| 8,169,015 | B2 | 5/2012 | Hirota |
| 8,927,384 | B2 | 1/2015 | Kim et al. |
| 9,087,729 | B2 | 7/2015 | Park et al. |
| 10,079,237 | B2 | 9/2018 | Kim et al. |
| 10,276,668 | B2 * | 4/2019 | Kim .................. H01L 21/76801 |
| 2014/0015099 | A1 | 1/2014 | Hwang |

(Continued)

FOREIGN PATENT DOCUMENTS

KR    10-2018-0066422 A    6/2018

OTHER PUBLICATIONS

Japanese Office Action dated Oct. 3, 2023 issued in Japanese Patent Application No. 2019-193259.

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

A method of manufacturing a semiconductor device includes sequentially stacking a mold layer and a supporter layer on a substrate, forming a plurality of capacitor holes passing through the mold layer and supporter layer, forming a plurality of lower electrodes filling the capacitor holes, forming a supporter mask pattern having a plurality of mask holes on the supporter layer and the lower electrodes, and forming a plurality of supporter holes by patterning the supporter layer. Each of the plurality of lower electrodes has a pillar shape, and each of the mask holes is between four adjacent lower electrodes and has a circular shape.

20 Claims, 16 Drawing Sheets

(56) References Cited

U.S. PATENT DOCUMENTS

| | | |
|---|---|---|
| 2018/0026040 A1 | 1/2018 | Hong et al. |
| 2018/0166320 A1 | 6/2018 | Kim |
| 2018/0166447 A1 | 6/2018 | Pak et al. |
| 2018/0301457 A1 | 10/2018 | Lee et al. |

* cited by examiner

SEMICONDUCTOR DEVICE HAVING SUPPORTER PATTERN

CROSS-REFERENCE TO RELATED APPLICATION

This application is a continuation of U.S. application Ser. No. 16/556,786, filed on Aug. 30, 2019, now U.S. Pat. No. 11,245,001, which claims priority from Korean Patent Application No. 10-2019-0032331, filed on Mar. 21, 2019, the disclosure of each of which is incorporated herein by reference in its entirety.

BACKGROUND

Devices consistent with some example embodiments relate to a semiconductor device having a supporter pattern.

Since highly integrated and miniaturized semiconductor devices such as Dynamic Random Access Memory (DRAM) are in demand, sizes of capacitors of the semiconductor devices also have been miniaturized. Lower electrodes having high aspect ratios are utilized to obtain specific/predetermined capacitances of the capacitors disposed in fine patterns. Supporter patterns which support the lower electrodes are utilized to prevent or reduce the likelihood of the lower electrodes collapsing during the process.

SUMMARY

Some example embodiments of inventive concepts are directed to providing a method of manufacturing a semiconductor device in which contact areas between supporter patterns and lower electrodes are uniform or significantly uniform.

According to some example embodiments, there is provided a method of manufacturing a semiconductor device including sequentially stacking a mold layer and a supporter layer on a substrate, forming a plurality of capacitor holes, the plurality of capacitor holes passing through the mold layer and the supporter layer, forming a plurality of lower electrodes filling the capacitor holes, the plurality of lower electrodes arranged in a first direction and a second direction which intersects with the first direction, forming, on the supporter layer and the lower electrodes, a supporter mask pattern, the supporter mask pattern a plurality of mask holes, and forming a plurality of supporter holes by patterning the supporter layer using the supporter mask pattern. Each of the plurality of lower electrodes has a pillar shape, each of the mask holes is between four adjacent lower electrodes, and each of the mask holes has a circular shape.

According to some example embodiments, there is provided a method of manufacturing a semiconductor device including sequentially stacking a mold layer and a supporter layer on a substrate, forming a plurality of capacitor holes passing through the mold layer and the supporter layer, forming a plurality of lower electrodes filling the capacitor holes, the plurality of lower electrodes arranged in a first direction and a second direction which intersects with the first direction, forming, on the supporter layer and the lower electrodes, a supporter mask pattern, the supporter mask pattern comprising a plurality of mask holes, and forming a plurality of first supporter holes and a plurality of second supporter holes arranged in a direction which is different from a direction of the first supporter holes by patterning the supporter layer using the supporter mask pattern. Each of the plurality of lower electrodes has a pillar shape, each of the mask holes is between four adjacent lower electrodes, and each of the mask holes has a circular shape.

According to some example embodiments, there is provided a method of manufacturing a semiconductor device including sequentially stacking a mold layer and a supporter layer on a substrate, forming a plurality of capacitor holes passing through the mold layer and the supporter layer, forming a plurality of lower electrodes filling the capacitor holes, the plurality of lower electrodes arranged in a first direction and a second direction which intersects with the first direction, and the plurality of electrodes are arranged in a honeycomb structure in which the plurality of lower electrodes are at centers and vertices of hexagons, forming, on the supporter layer and the lower electrodes, a supporter mask pattern, the support mask pattern comprising a plurality of mask holes, and forming a plurality of supporter holes by patterning the supporter layer using the supporter mask pattern. Each of the plurality of lower electrodes has a pillar shape and, each of the plurality of lower electrodes is exposed by at least one among the plurality of supporter holes. Each of the mask holes is between four adjacent lower electrodes, each of the mask holes has a circular shape, each of the supporter holes is between the four adjacent lower electrodes, and each of the supporter holes has an oval shape.

BRIEF DESCRIPTION OF THE DRAWINGS

The above and other objects, features, and advantages of inventive concepts will become more apparent to those of ordinary skill in the art by describing example embodiments thereof in detail with reference to the accompanying drawings, in which.

DETAILED DESCRIPTION

Figure 1:
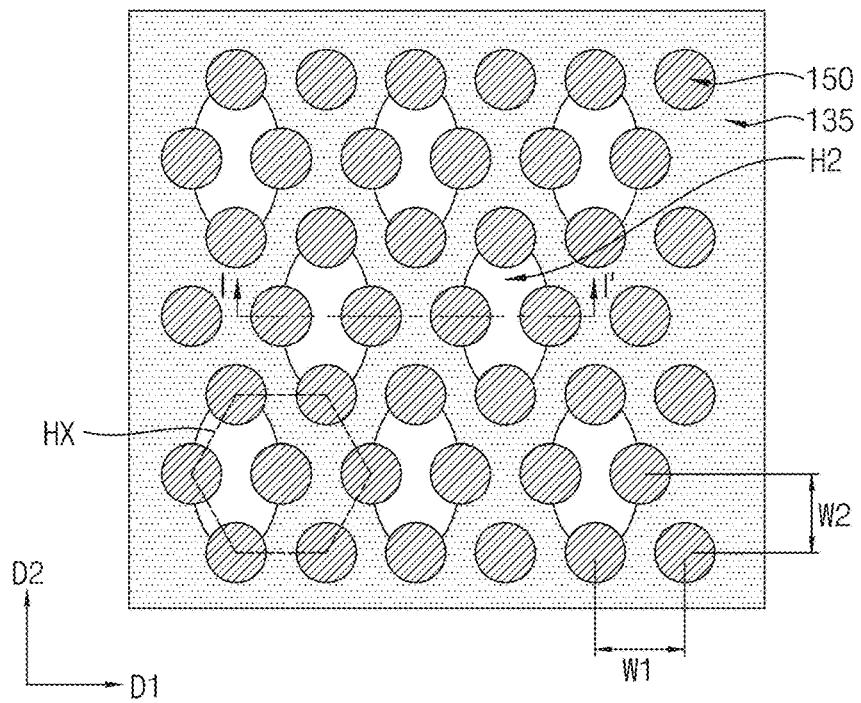
FIG. 1 is a plan view illustrating a semiconductor device according to some example embodiments of inventive concepts.
Figure 2:
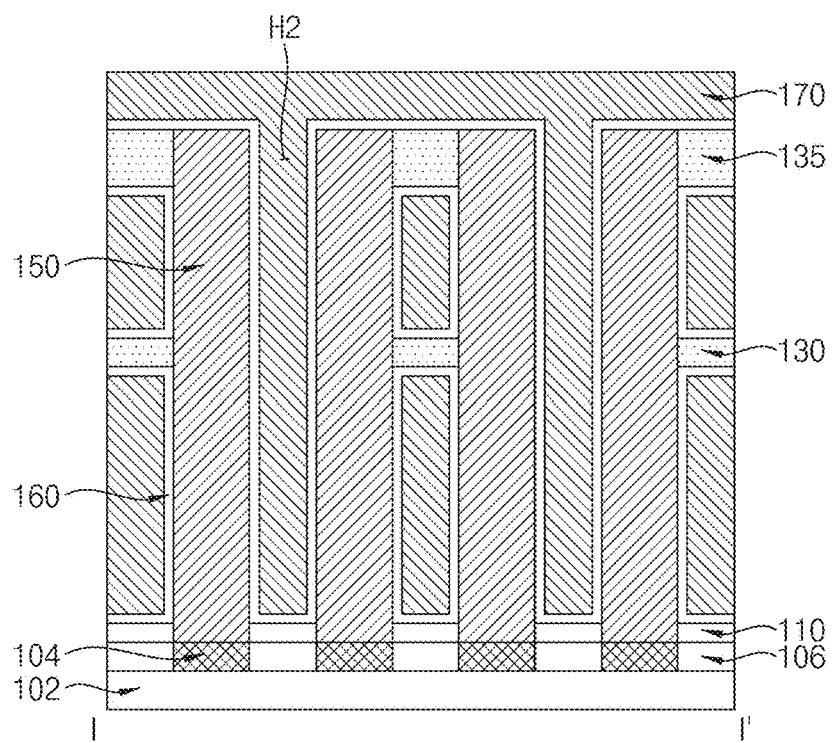
FIG. 2 is a vertical cross-sectional view of the semiconductor device taken along line I-I' of FIG. 1.

FIG. 1 is a plan view illustrating a semiconductor device according to some example embodiments of inventive concepts. FIG. 2 is a vertical cross-sectional view of the semiconductor device taken along line I-I' of FIG. 1.

Referring to FIGS. 1 and 2, a semiconductor device 100 may include a substrate 102, contact plugs 104, a lower insulation layer 106, an etch stop film 110, a lower supporter pattern 130, an upper supporter pattern 135, lower electrodes 150, a capacitor dielectric layer 160, and an upper electrode 170.

The substrate 102 may include a semiconductor material. For example, the substrate 102 may be or may include a silicon substrate, a germanium substrate, a silicon-germanium substrate, or a silicon on insulator (SOI) substrate. Although not illustrated, a plurality of switching elements such as a transistor may be disposed on the substrate 102. The plurality of switching elements may include a plurality of word lines and a plurality of bit lines crossing the plurality of word lines.

The contact plugs 104 and the lower insulation layer 106 may be disposed on the substrate 102. The plurality of contact plugs 104 may be disposed to be buried in the lower insulation layer 106. An upper surface of each of the contact plugs 104 may be positioned at the same level as an upper surface of the lower insulation layer 106. However, the plurality of contact plugs 104 are not limited thereto, and in some example embodiments, the upper surface of the contact plug 104 may be positioned at a level which is lower than the upper surface of the lower insulation layer 106. A width of the contact plug 104 may be the same as that of a lower surface of each of the lower electrodes 150. The contact plugs 104 may be electrically connected to first lower electrodes 150. The lower insulation layer 106 may insulate the contact plugs 104 to prevent or reduce the likelihood that the plurality of contact plugs 104 are electrically connected to each other.

The contact plug 104 may include a conductive material. For example, the contact plug 104 may include a semiconductor material such as polysilicon (e.g. doped polysilicon), a metal-semiconductor compound such as $WSi_2$, a metal nitride such as TiN and TaN, and/or a metal such as Ti, W, and Ta. The lower insulation layer 106 may include a silicon oxide, a silicon nitride, a silicon oxynitride, or a combination thereof.

The etch stop film 110 may be disposed on the lower insulation layer 106. In some example embodiments, the etch stop film 110 may include a silicon nitride, a silicon oxynitride, or a combination thereof. In addition, the etch stop film 110 may prevent or reduce the likelihood of an etchant from leaking under the first lower electrode 150 during a wet etching process, thereby preventing or reducing the likelihood of the lower insulation layer 106 from being etched.

The plurality of lower electrodes 150 may be disposed on the contact plugs 104. The lower electrode 150 may be electrically connected to the contact plug 104 and may include a metal such as Ti, W, Ni, and Co, or a metal nitride such as TiN, TiSiN, TiAlN, TaN, TaSiN, and/or WN. In some example embodiments, the lower electrode 150 may include TiN. An upper surface of the lower electrode 150 may be positioned at the same level as an upper surface of the upper supporter pattern 135.

Referring to FIG. 1, the lower electrodes 150 may be disposed to be spaced apart from each other by a distances, e.g. a predetermined distance, in the plan view seen from above. In some example embodiments, the lower electrodes 150 may have a honeycomb structure in which the lower electrodes 150 are disposed at centers and vertices of hexagons, e.g. regular hexagons HX having a same side length and a same angle between sides. For example, letting F refer to a minimum photolithographic feature size, a distance W1 between the centers of the lower electrodes 150 spaced in a first direction D1 may be 3.0 F. A distance W2 between the centers of the lower electrodes 150 spaced in a second direction D2 may be about 2.6 F, e.g. about 1.5 times the square root of 3 F. For example, the distance W2 may be related to the distance W1 by a formula for sides of a 30-60-90 degree triangle.

The lower supporter pattern 130 and the upper supporter pattern 135 may be disposed between the lower electrodes 150. The lower supporter pattern 130 and the upper supporter pattern 135 may connect and support the lower electrodes 150.

As illustrated in FIG. 1, the lower supporter pattern 130 and the upper supporter pattern 135 may have mesh shapes in which openings having constant patterns are formed on plates. The lower supporter pattern 130 and the upper supporter pattern 135 may include insulation materials such as a silicon nitride, a silicon oxynitride, or a combination thereof.

A thickness of the upper supporter pattern 135 may be greater than that of the lower supporter pattern 130. The lower supporter pattern 130 and the upper supporter pattern 135 may have the same shape when viewed in a plan view, e.g. from above. In some example embodiments, a side surface of a first supporter pattern in contact with the first lower electrode 150 may be coplanar with that of a second supporter pattern in contact with a second lower electrode 150.

The upper supporter pattern 135 may include a plurality of supporter holes H2. Each of the supporter holes H2 may be disposed between four adjacent lower electrodes 150. The supporter holes H2 may have an oval shape having a minor axis in the first direction D1 and a major axis in the second direction D2. The plurality of supporter holes H2 may be disposed to be spaced apart from each other by about 6.0 F. In some example embodiments, the plurality of supporter holes H2 may have a honeycomb structure in which the holes H2 are disposed at central points and vertices of hexagons. Since the supporter holes H2 are disposed to have the above-described honeycomb structure, all of the lower electrodes 150 may be substantially opened. For example, the lower electrodes 150 may be exposed by at least one of the plurality of supporter holes H2.

The capacitor dielectric layer 160 may be disposed between the lower electrodes 150 and the upper electrode 170. For example, the capacitor dielectric layer 160 may be conformally disposed on surfaces of the etch stop film 110, the lower electrodes 150, the lower supporter pattern 130, and the upper supporter pattern 135. The capacitor dielectric layer 160 may include a metal oxide such as $HfO_2$, $ZrO_2$, $Al_2O_3$, $La_2O_3$, $Ta_2O_3$, and $TiO_2$, a dielectric material such as $SrTiO_3$ (strontium titanate (STO)), $BaTiO_3$, lead zirconate titanate (PZT), and lead lanthanum zirconate titanate (PLZT) having a perovskite structure, or a combination thereof.

The upper electrode 170 may be disposed on the capacitor dielectric layer 160. The upper electrode 170 may include a metal such as Ti, W, Ni, and Co, or a metal nitride such as TiN, TiSiN, TiAlN, TaN, TaSiN, and WN. In some example embodiments, the upper electrode 170 may include TiN.

FIGS. 3 to 7, 9, 11, and 12 are cross-sectional views for describing a method of manufacturing a semiconductor device according to a process sequence according to some example embodiments of inventive concepts.

Figure 3:
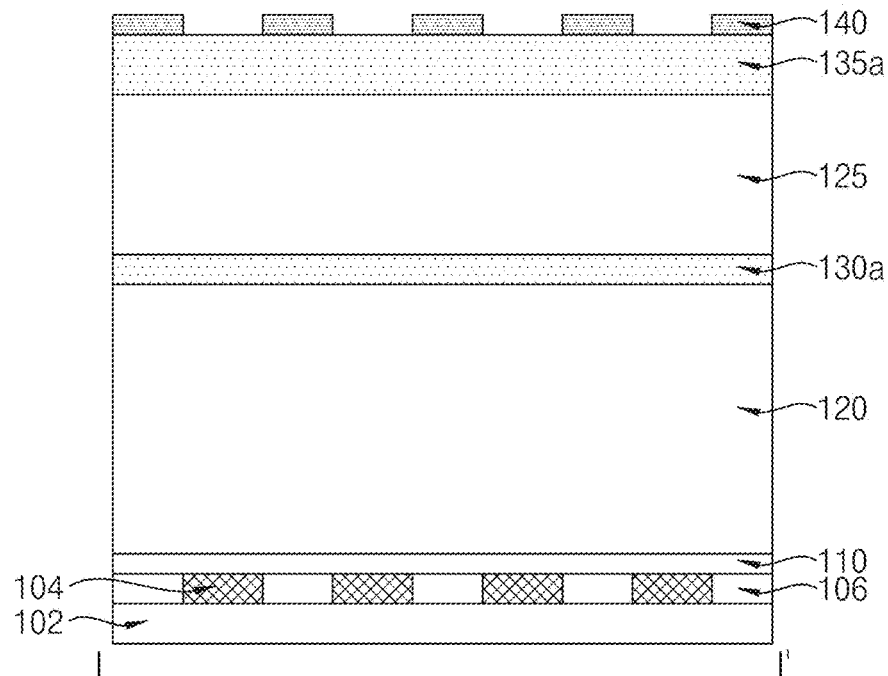
FIGS. 3 to 7, 9, 11, and 12 are cross-sectional views for describing a method of manufacturing a semiconductor device according to a process sequence according to some example embodiments of inventive concepts.

Referring to FIG. 3, a lower insulation layer 106 in which contact plugs 104 are buried may be disposed on a substrate 102. An etch stop film 110, a lower mold layer 120, a lower supporter layer 130a, an upper mold layer 125, an upper supporter layer 135a, and a capacitor mask pattern 140 may be sequentially stacked on the contact plugs 104 and the lower insulation layer 106.

The etch stop film 110 may be disposed on the lower insulation layer 106. The etch stop film 110 may include a material having an etch selectivity with respect to the lower mold layer 120 and the upper mold layer 125. In some example embodiments, the etch stop film 110 may include a silicon nitride.

Each of the lower mold layer 120 and the upper mold layer 125 may include a material having an etch selectivity with respect to the lower supporter layer 130a and the upper supporter layer 135a. For example, each of the lower mold layer 120 and the upper mold layer 125 may include a silicon oxide, and each of the lower supporter layer 130a and the upper supporter layer 135a may include a silicon nitride. Both of, or at least one of, the lower mold layer 120 and the upper mold layer 135 may be formed with a chemical vapor deposition (CVD) process, such as a plasma-enhanced CVD (PECVD) process and/or a low pressure CVD (LPCVD) furnace process; however, inventive concepts are not limited thereto.

The capacitor mask pattern 140 may expose some of the upper supporter layer 135a. The capacitor mask pattern 140 may define regions in which lower electrodes 150 are disposed. The capacitor mask pattern 140 may include amorphous carbon or polysilicon. The capacitor mask pattern 140 may be formed with photolithographic process.

Figure 4:
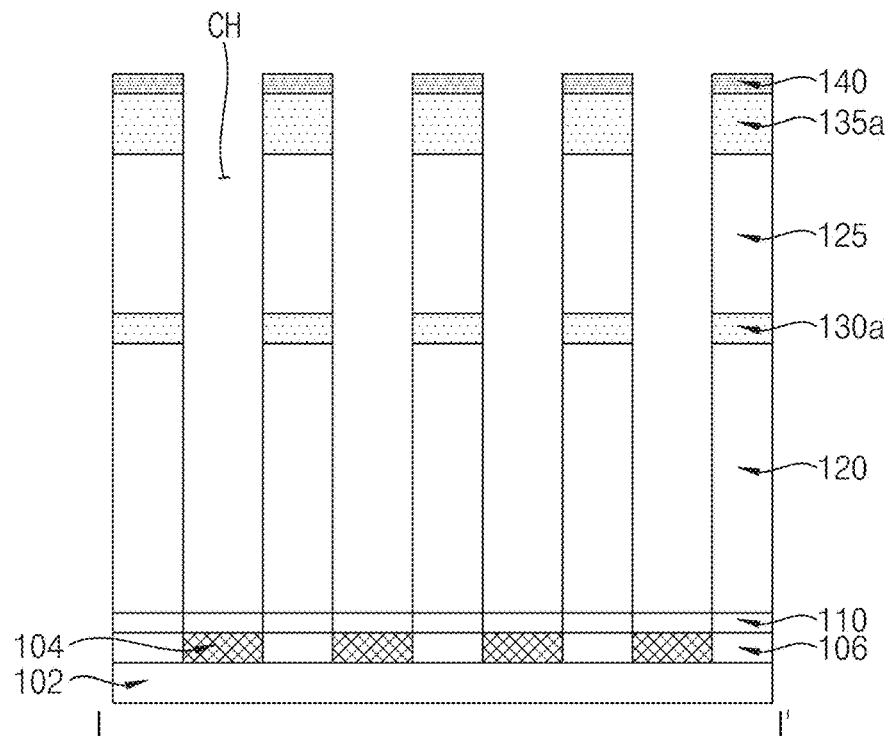

Referring to FIG. 4, a plurality of capacitor holes CH may be formed according to the capacitor mask pattern 140. Each of the capacitor holes CH may be formed to pass through the etch stop film 110, the lower mold layer 120, the lower supporter layer 130a, the upper mold layer 125, and the upper supporter layer 135a. The capacitor hole CH may have a width, e.g. a predetermined width, and in some example embodiments, the capacitor hole CH may be formed such that a width thereof decreases in a downward direction.

The capacitor hole CH may be formed by a dry etching process such as a reactive ion etching (RIE) process. For example, after the upper supporter layer 135a, the upper mold layer 125, the lower supporter layer 130a, and the lower mold layer 120 are sequentially and anisotropically etched, some of the etch stop film 110 may be removed to expose the contact plugs 104.

Figure 5:
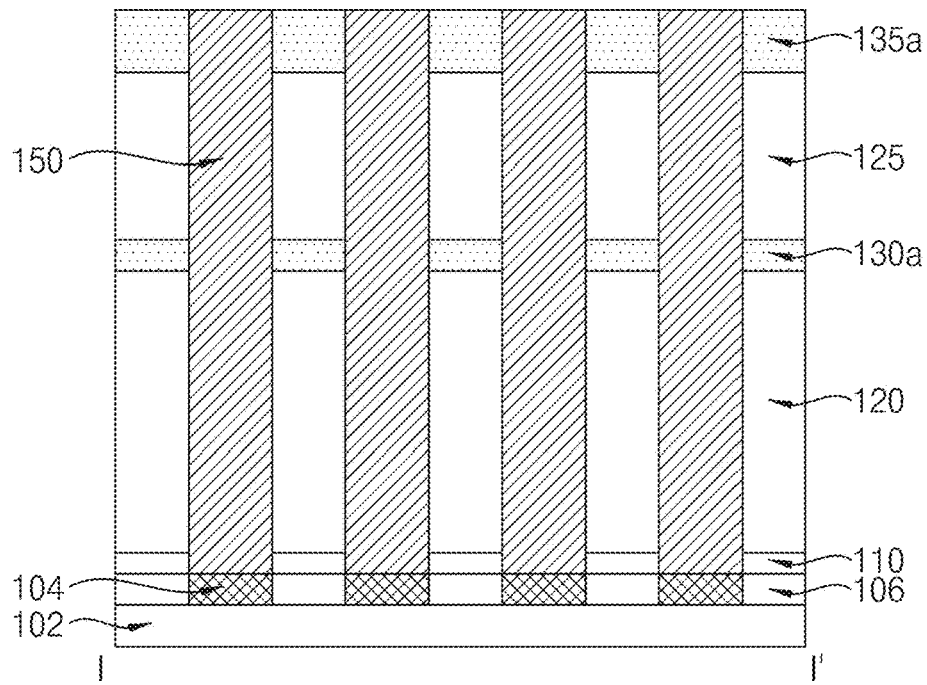
Figure 6:
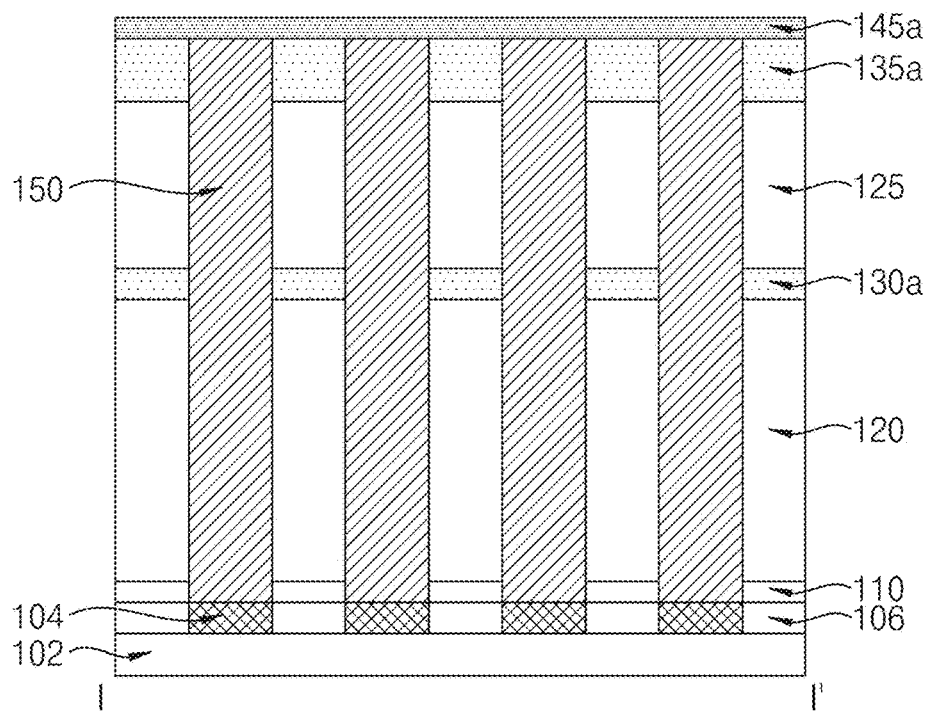

Referring to FIG. 5, the lower electrodes 150 may be formed in the capacitor hole CH. The lower electrodes 150 may be formed by a chemical vapor deposition (CVD) process, an atomic layer deposition (ALD) process, a plasma enhanced atomic layer deposition (PEALD) process, and/or the like. The lower electrodes 150 may include a metal such as Ti, W, Ni, and Co, or a metal nitride such as TiN, TiSiN, TiAlN, TaN, TaSiN, and WN. After the lower electrodes 150 are formed, a planarization process may be performed. Some of the lower electrodes 150 and the capacitor mask pattern 140 may be removed by the planarization process. The planarization process may be or may include an etch-back process and/or a chemical mechanical planarization (CMP) process; however, inventive concepts are not limited thereto Referring to FIG. 6, a supporter mask layer 145a may be formed on the structure shown in FIG. 5. For example, the supporter mask layer 145a may be disposed on the upper supporter layer 135a and the lower electrodes 150. In some example embodiments, the supporter mask layer 145a may be or may include a hard mask and include amorphous carbon and/or polysilicon.

Figure 7:
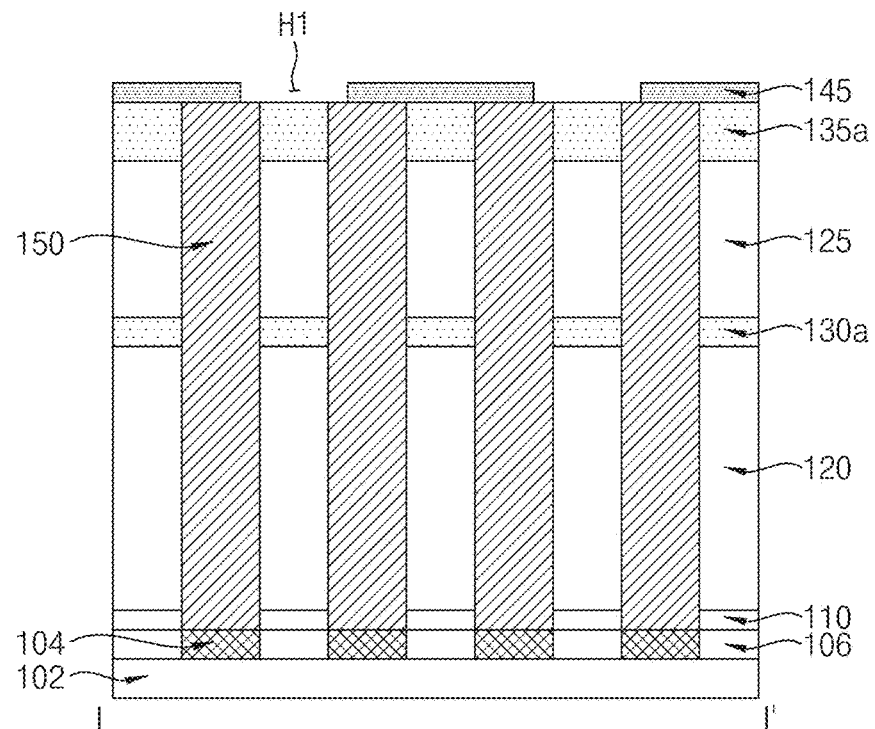
Figure 8:
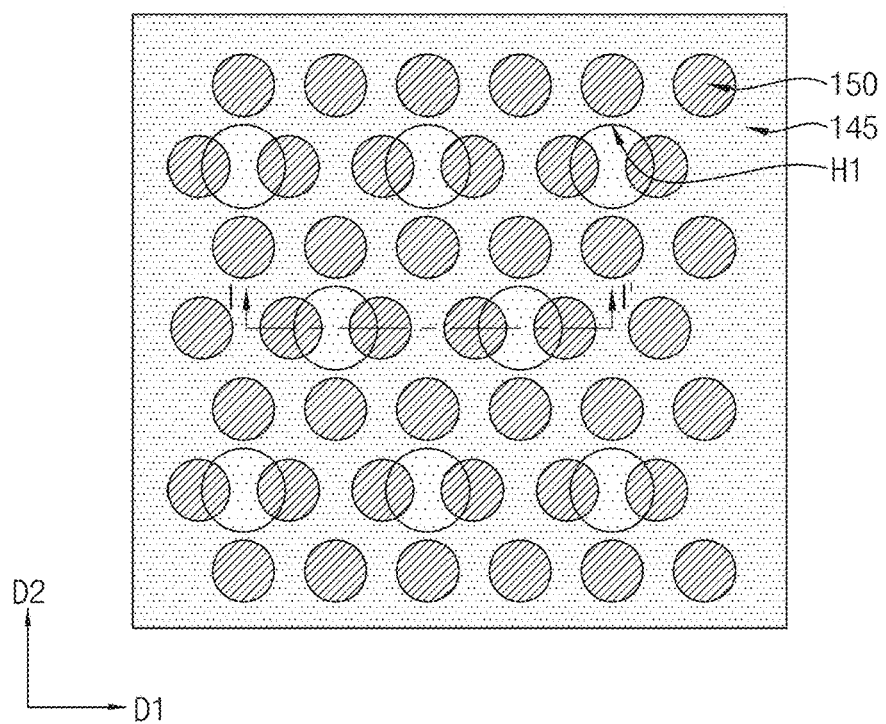
FIG. 8 is a plan view illustrating the supporter mask pattern according to some example embodiments of inventive concepts.

FIG. 8 is a plan view illustrating the supporter mask pattern 145 according to some example embodiments of inventive concepts. FIG. 7 may correspond to a vertical cross-sectional view taken along line I-I' of FIG. 8.

Referring initially to FIG. 7, some of the supporter mask layer 145a may be etched to form a supporter mask pattern 145. In some example embodiments, the supporter mask layer 145a may be patterned by an exposure process using a photomask. The supporter mask pattern 145 may include a plurality of mask holes H1. The mask holes H1 may expose some of the upper supporter layer 135a, e.g. may open a top surface of the upper supporter layer 135a. In addition, each of the mask holes H1 may expose a part of the lower electrode 150, e.g. may open a top surface of the lower electrode 150. However, inventive concepts are not limited thereto. For example, in some example embodiments, the lower electrodes 150 may not be exposed by the mask holes H1.

Referring to FIG. 8, each of the mask holes H1 may have a circular shape and may open/expose two lower electrodes 150. The mask holes H1 may be disposed to have a pattern, e.g. a predetermined pattern. For example, each of the mask holes H1 may be disposed between four adjacent lower electrodes 150. Each of the mask holes H1 may be positioned between two adjacent lower electrodes 150 spaced apart from each other in a first direction D1. A distance between the two adjacent mask holes H1 may be two times a distance between the lower electrodes 150. For example, the distance between the adjacent mask holes H1 may be 6.0 F. The plurality of mask holes H1 may have a honeycomb structure in which the plurality of mask holes H1 are disposed at centers and vertices of hexagons.

Figure 9:
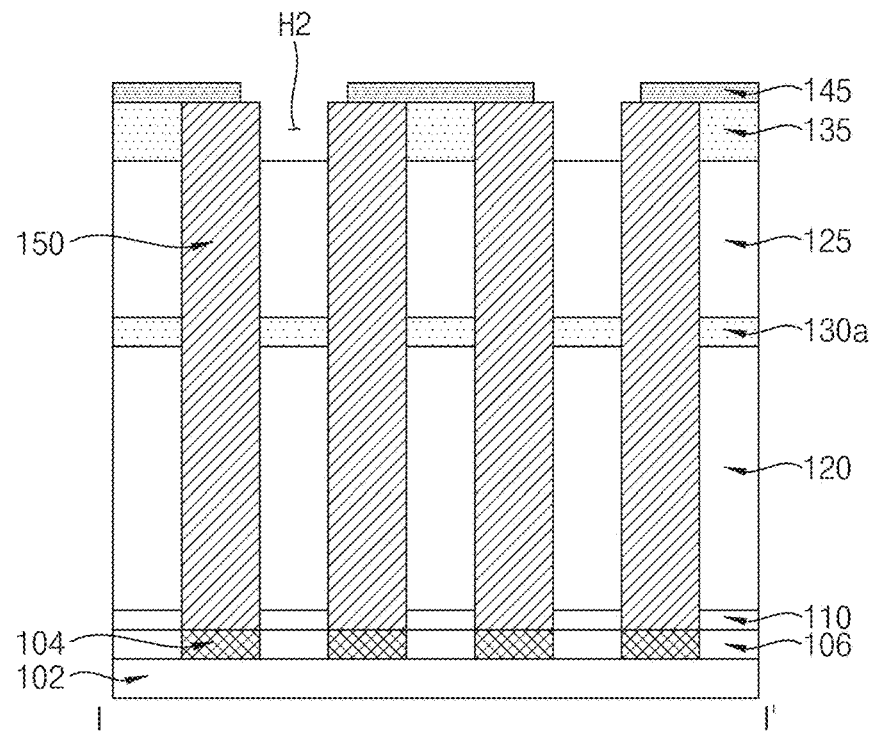
Figure 10:
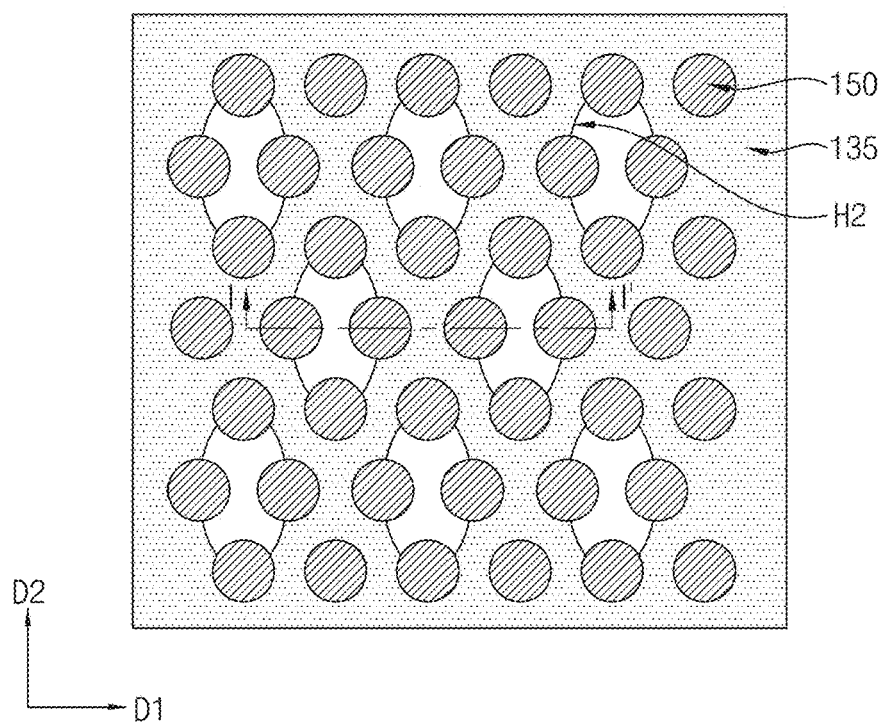
FIG. 10 is a plan view illustrating the upper supporter pattern according to some example embodiments of inventive concepts.
Figure 11:
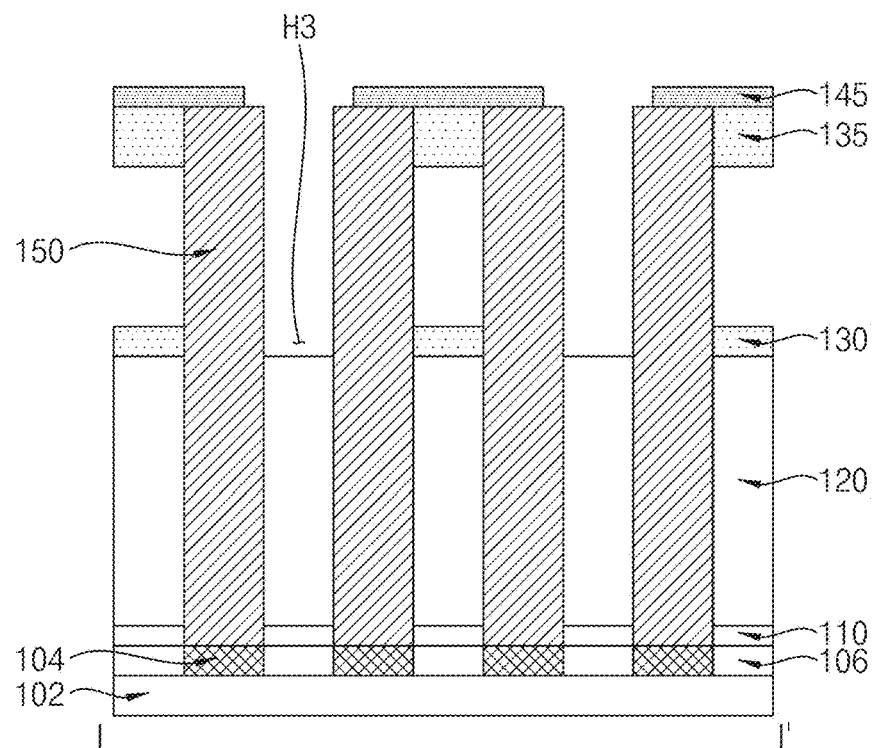
Figure 12:
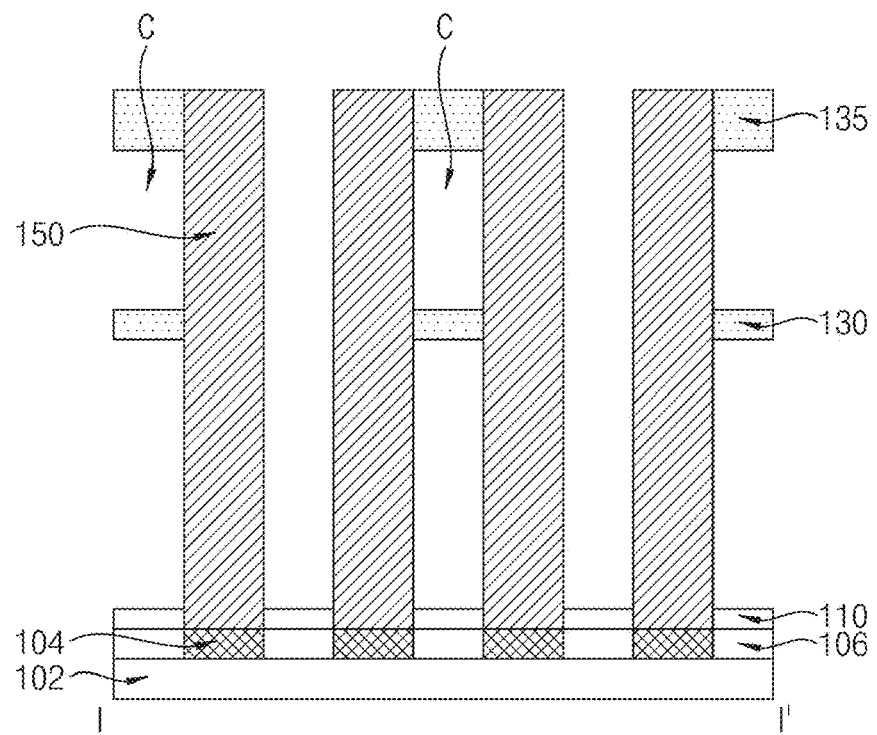

FIG. 10 is a plan view illustrating the upper supporter pattern according to some example embodiments of inventive concepts. FIGS. 9, 11, and 12 may correspond to a process of manufacturing according to a vertical cross-sectional view taken along line I-I' of FIG. 10.

Referring initially to FIG. 9, some of the upper supporter layer 135a may be etched using the supporter mask pattern 145 to form an upper supporter pattern 135. The upper supporter pattern 135 may be formed by a dry etching process. When a patterning process is performed, the lower electrodes 150 having an etch selectivity with respect to the upper supporter pattern 135 may not be etched. However, the lower electrodes 150 are not limited thereto, and in some example embodiments, some of the lower electrodes 150 may also be etched. Some of the upper mold layer 125 may be exposed by the upper supporter pattern 135.

Referring to FIG. 10, the supporter pattern may include a plurality of supporter holes H2. The supporter holes H2 may be formed at positions of the corresponding mask holes H1, and a width of the supporter hole H2 may be greater than that of the mask hole H1. Each of the supporter holes H2 has an oval shape and may be formed across four adjacent lower electrodes 150. For example, the supporter hole H2 may have an oval shape having a minor axis in the first direction D1 and a major axis in the second direction D2. A distance between centers of the supporter holes H2 may be 6.0 F. The plurality of supporter holes H2 may have a honeycomb structure in which the plurality of supporter holes H2 are disposed at centers and vertices of hexagons.

Referring to FIGS. 10 and 11, the upper mold layer 125 may be removed. The upper mold layer 125 may be removed by a wet etching process. For example, in a case in which the upper mold layer 125 includes a silicon oxide, an etching process may be performed using a solution including HF, $NH_4F$, or the like. When the etching process is performed, the lower supporter pattern 130 and the upper supporter pattern 135 having an etch selectivity with respect to the upper mold layer 125 may not be removed.

Next, some of the lower supporter layer 130a may be etched using the supporter mask pattern 145. The lower supporter layer 130a may be patterned to form the lower supporter pattern 130. The lower supporter pattern 130 includes the plurality of supporter holes H2 and may have substantially the same shape as the upper supporter pattern 135. In some example embodiments, supporter holes H3 may be smaller than the supporter holes H2.

Referring to FIG. 12, the lower mold layer 120 may be removed. For example, the lower mold layer 120 may be removed by a wet etching process. The etch stop film 110, the lower supporter pattern 130, and the upper supporter pattern 135 having an etch selectivity with respect to the lower mold layer 120 may not be removed. The lower mold layer 120 is removed so that a cavity C may be formed between the lower electrodes 150 and between the lower supporter pattern 130 and the upper supporter pattern 135. The lower supporter pattern 130 and the upper supporter pattern 135 may support and connect the plurality of lower electrodes 150.

Referring to FIG. 2 again, a capacitor dielectric layer 160 and an upper electrode 170 may be formed on the resultant structure shown in FIG. 12. For example, the capacitor dielectric layer 160 may be conformally formed along surfaces of the etch stop film 110, the lower supporter pattern 130, the upper supporter pattern 135, and the lower electrodes 150.

The capacitor dielectric layer 160 may include a metal oxide such as $HfO_2$, $ZrO_2$, $Al_2O_3$, $La_2O_3$, $Ta_2O_3$, and/or $TiO_2$, a dielectric material such as $SrTiO_3$ (STO), $BaTiO_3$, PZT, and PLZT having a perovskite structure, and/or a combination thereof. The capacitor dielectric layer 160 may be formed by a CVD process, and/or an ALD process, and/or the like.

The upper electrode 170 may be formed to cover the capacitor dielectric layer 160. The upper electrode 170 may fill all spaces between the lower electrodes 150, between the lower supporter pattern 130 and the upper supporter pattern 135, and the like. The lower electrodes 150, the capacitor dielectric layer 160, and the upper electrode 170 may function as a capacitor.

The upper electrode 170 may include the same material as a first lower electrode 150 and a second lower electrode 150. For example, the upper electrode 170 may include TiN. The upper electrode 170 may be formed by a CVD process, an ALD process, or the like.

As illustrated in FIGS. 7 to 10, the mask hole H1 may be disposed between four adjacent lower electrodes 150. Each of the supporter holes H2 formed according to a pattern of the mask holes H1 may be disposed between the four adjacent lower electrodes 150 to substantially open all of the lower electrodes 150. Since all of the lower electrodes 150 are opened, following processes may be uniformly or more uniformly performed. In addition, since the supporter holes H2 are formed along the pattern of the circular mask holes H1, the adjacent supporter holes H2 may be prevented, or reduced in likelihood, from being connected to each other. Accordingly, a problem in that the lower electrodes 150 collapse during a process may be prevented or reduced in likelihood.

Figure 13:
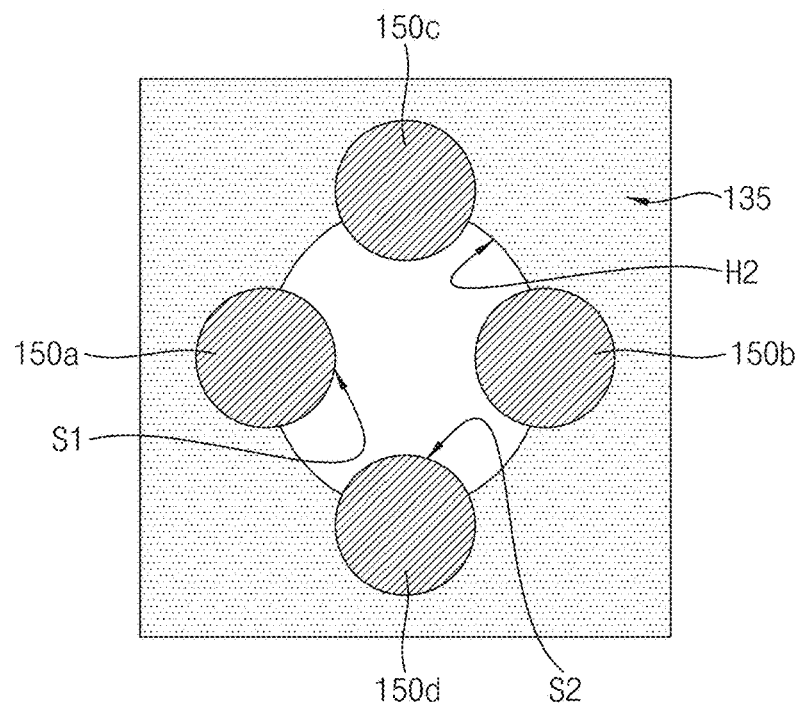
FIG. 13 is an enlarged view illustrating a part of an upper supporter pattern according to some example embodiments of inventive concepts.

FIG. 13 is an enlarged view illustrating a part of an upper supporter pattern according to some example embodiments of inventive concepts.

Referring to FIGS. 8 and 13, a mask hole H1 may be formed across two adjacent lower electrodes 150. An upper supporter layer 135a may be patterned using the mask hole H1 to form a supporter hole H2 which opens four lower electrodes 150. Since the upper supporter layer 135a is etched from a portion exposed by the mask hole H1, the two exposed lower electrodes 150 may be opened more than the two remaining lower electrodes 150. In some example embodiments, a first lower electrode 150a and a second lower electrode 150b may be exposed by the mask hole H1 before the supporter hole H2 is formed. The supporter hole H2 formed by a patterning process may open the first lower electrode 150a, the second lower electrode 150b, a third lower electrode 150c, and a fourth lower electrode 150d. The first lower electrode 150a and the second lower electrode 150b may be opened more than the third lower electrode 150c and the fourth lower electrode 150d. For example, a first area S1 by which the first lower electrode 150a or the second lower electrode 150b is opened may be larger than a second area S2 by which the third lower electrode 150c or the fourth lower electrode 150d is opened.

FIGS. 14A, 15A, 16A, 17A, and 18A are plan views illustrating supporter mask patterns according to some example embodiments of inventive concepts. FIGS. 14B, 15B, 16B, 17B, and 18B are plan views illustrating upper supporter patterns according to some example embodiments of inventive concepts. Each upper supporter pattern 135 illustrated in FIGS. 14B, 15B, 16B, 17B, and 18B includes a plurality of supporter holes H2 having oval shapes, and the plurality of supporter holes H2 may substantially open all lower electrodes 150. For example, the supporter holes H2 may be disposed such that all of the lower electrodes 150 are opened in the remaining regions except for edge regions of the upper supporter patterns 135.

Figure 14A:
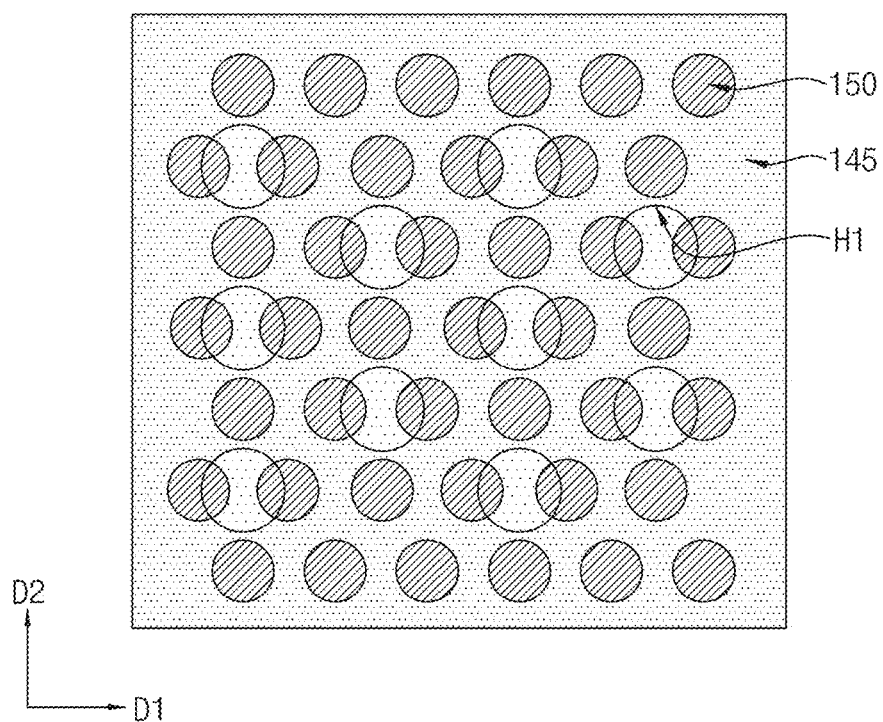
FIGS. 14A, 15A, 16A, 17A, and 18A are plan views illustrating supporter mask patterns according to some example embodiments of inventive concepts.
Figure 14B:
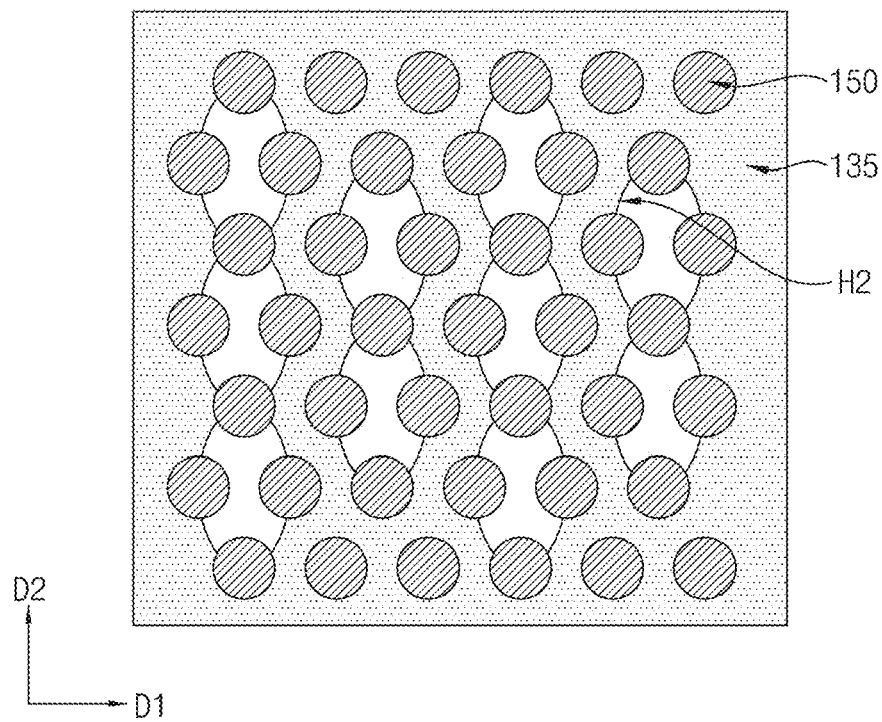
FIGS. 14B, 15B, 16B, 17B, and 18B are plan views illustrating upper supporter patterns according to some example embodiments of inventive concepts.

Referring to FIG. 14A, a supporter mask pattern 145 may include a plurality of mask holes H1. Referring to FIG. 14B, the upper supporter pattern 135 may be formed using the supporter mask pattern 145 illustrated in FIG. 14A.

The plurality of supporter holes H2 may be disposed to be spaced apart from each other by a distance, e.g. a predetermined distance, in a second direction D2 to form columns. For example, a distance between the plurality of supporter holes H2 forming the column may be about 5.2 F, e.g. about 3 times the square root of 3. In this specification, the distance between the supporter holes H2 may be defined as a distance between centers of the supporter holes H2. The columns may be disposed to be spaced apart from each other in a first direction D1. For example, the columns may be disposed to be spaced apart from each other by 4.5 F in the first direction D1. In addition, the adjacent columns may be disposed to be misaligned with each other, and for example, may be disposed in a lattice shape misaligned with each other by about 2.6 F in the second direction D2.

Figure 15A:
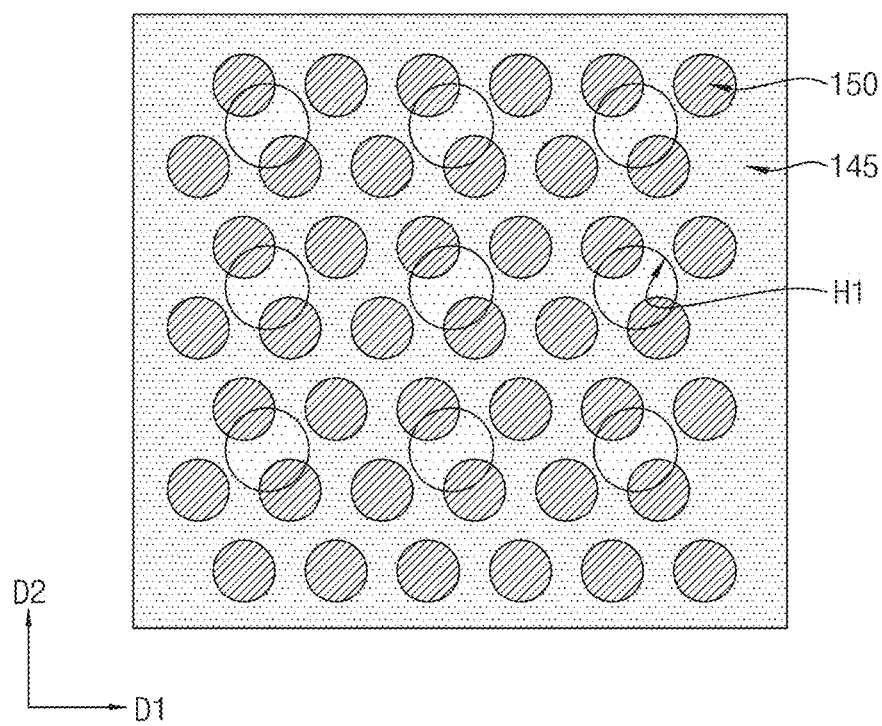
Figure 15B:
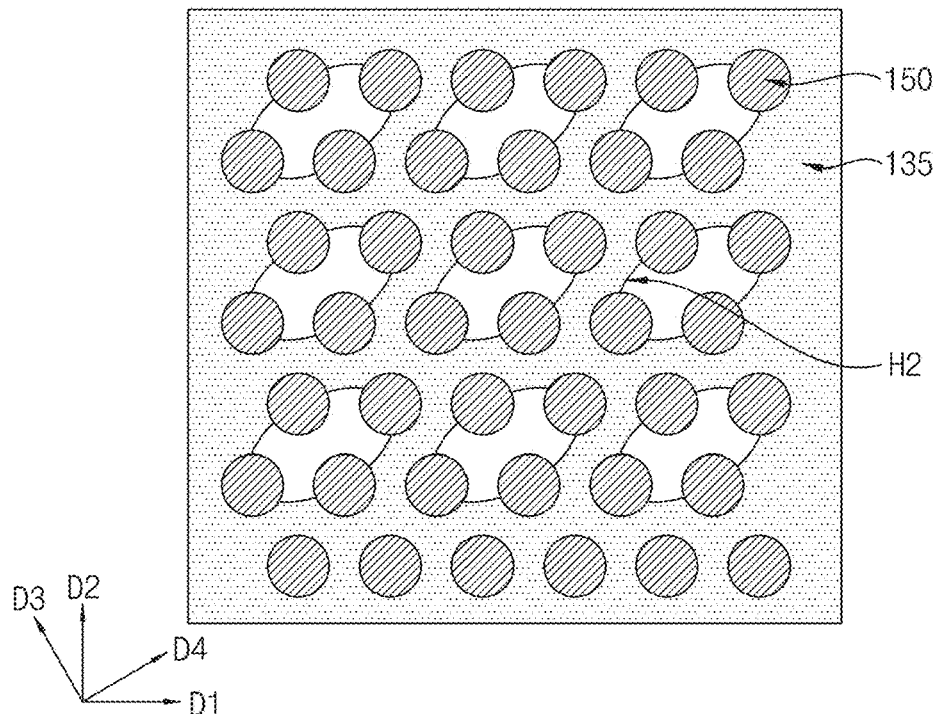

Referring to FIG. 15A, a supporter mask pattern 145 may include a plurality of mask holes H1. Referring to FIG. 15B, the upper supporter pattern 135 may be formed using the supporter mask pattern 145 illustrated in FIG. 15A.

The plurality of supporter holes H2 may be disposed to be spaced apart from each other by a distance, e.g. a predetermined distance, to form a lattice structure. For example, centers of the supporter holes H2 may be disposed to be spaced apart from each other by 6.0 F in the first direction D1 and the second direction D2. The supporter hole H2 may have an oval shape having a minor axis in a third direction D3 and a major axis in a fourth direction D4. Here, the third direction D3 may be defined as a direction inclined 30° from the second direction D2 in a counterclockwise direction. The fourth direction D4 may be defined as a direction inclined 30° from an axis of the first direction D1 in the counterclockwise direction. The third direction D3 may be orthogonal, or at right angles, to the fourth direction D4.

Figure 16A:
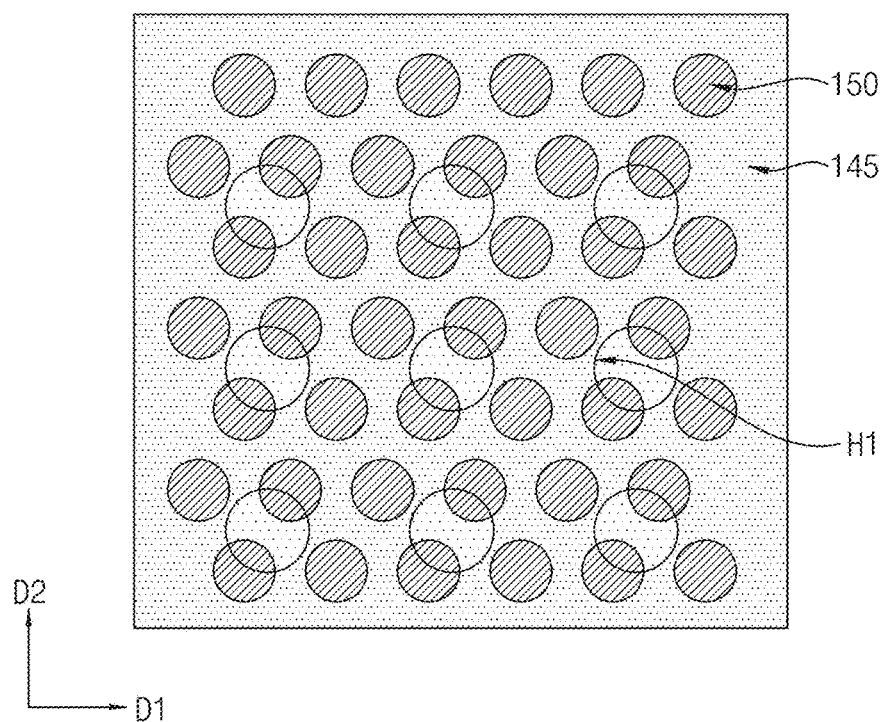
Figure 16B:
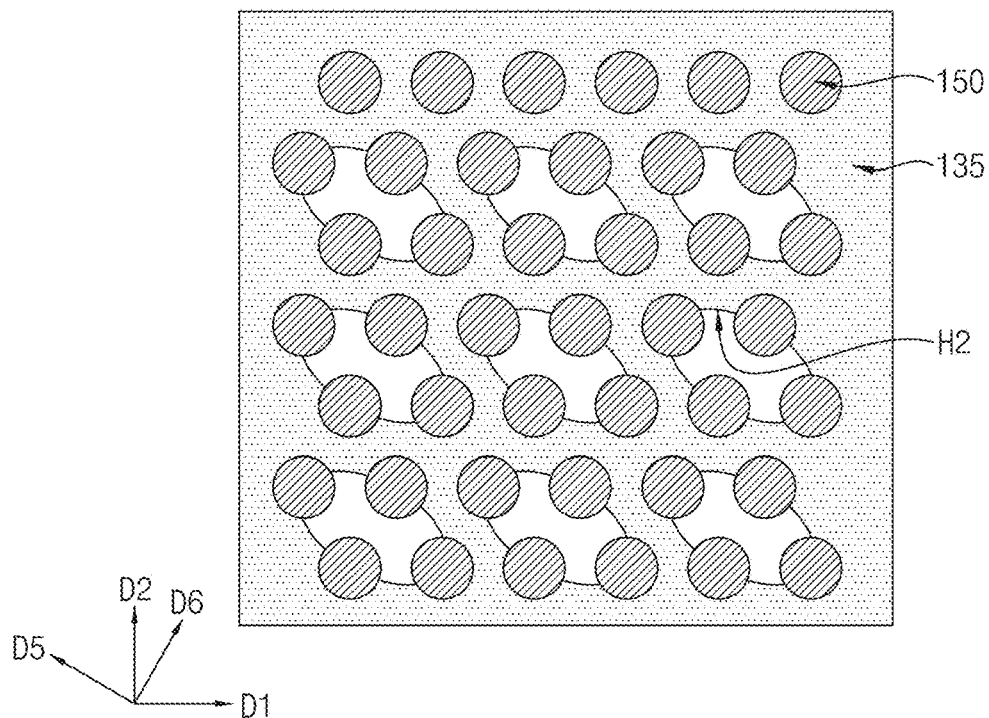

Referring to FIG. 16A, a supporter mask pattern 145 may include a plurality of mask holes H1. Referring to FIG. 16B, the upper supporter pattern 135 may be formed using the supporter mask pattern 145 illustrated in FIG. 16A.

The plurality of supporter holes H2 may be disposed to be spaced apart from each other by a distance, e.g. a predetermined distance, to form a lattice structure. For example, centers of the supporter holes H2 may be disposed to be spaced apart from each other by 6.0 F in the first direction D1 and the second direction D2. The supporter holes H2 may have an oval shape having a major axis in a fifth direction D5 and a minor axis in a sixth direction D6. Here, the fifth direction D5 may be defined as a direction inclined 30° from an axis of the first direction D1 in a clockwise direction. The sixth direction D6 may be a direction inclined 30° from an axis of the second direction D2 in a clockwise direction. The fifth direction D5 may be orthogonal, or at right angles, to the sixth direction D6.

Figure 17A:
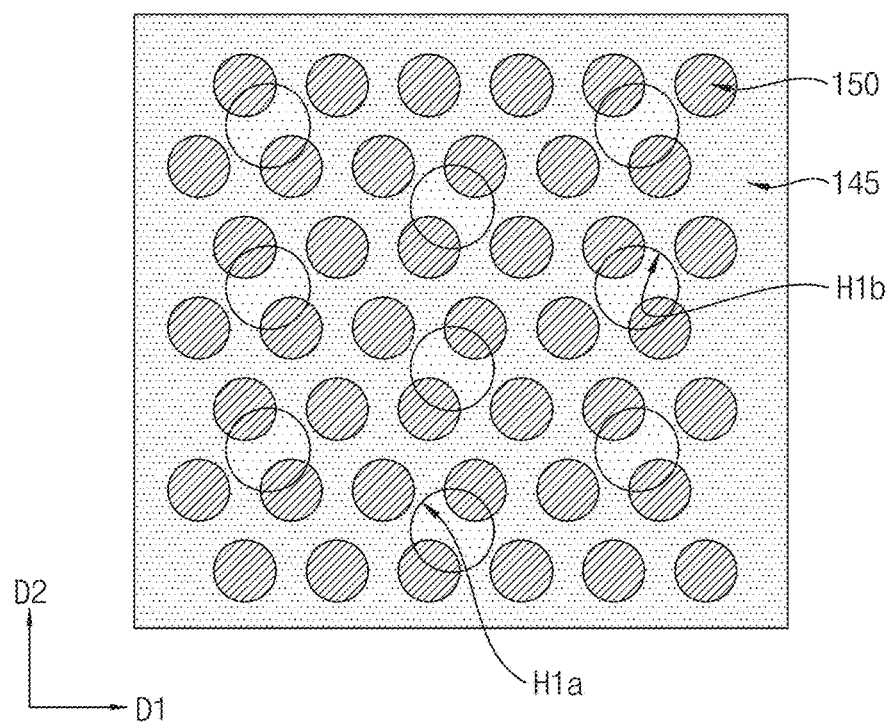
Figure 17B:
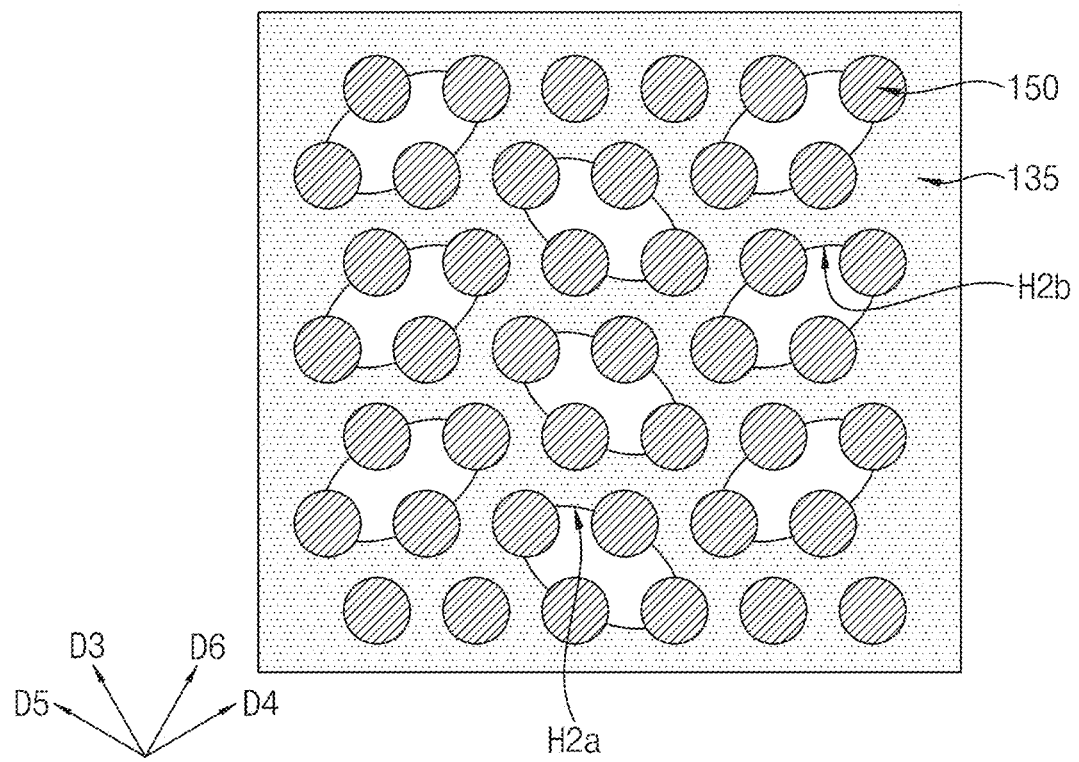

Referring to FIG. 17A, a supporter mask pattern 145 may include a plurality of first mask holes H1a and a plurality of second mask holes H1b. Referring to FIG. 17B, the upper supporter pattern 135 may be formed using the supporter mask pattern 145 illustrated in FIG. 17A.

The upper supporter pattern 135 may include a plurality of first supporter holes H2a and a plurality of second supporter holes H2b which are disposed to be misaligned. The plurality of first supporter holes H2a and the plurality of second supporter holes H2b may be respectively disposed at positions of the plurality of first mask holes H1a and the plurality of second mask holes H1b. The plurality of first supporter holes H2a or the second supporter holes H2b may form columns disposed to be spaced apart from each other in the second direction D2. For example, the plurality of first supporter holes H2a may form first columns spaced apart from each other by about 5.2 F, or about 3 times the square root of 3, in the second direction D2. In addition, the plurality of second supporter holes H2b may form second columns spaced apart from each other by about 5.2 F in the second direction D2. The first columns and the second columns may be alternately disposed in the first direction D1. For example, the columns may be disposed to be spaced apart from each other by 6.0 F in the first direction D1. In addition, the adjacent columns may be disposed to be misaligned with each other, and for example, may be disposed in a lattice shape misaligned with each other by about 2.6 F in the second direction D2. The first supporter holes H2a may have an oval shape having a major axis in the fifth direction D5 and a minor axis in the sixth direction D6. The second supporter holes H2b may have an oval shape having a minor axis in the third direction D3 and a major axis in the fourth direction D4.

Figure 18A:
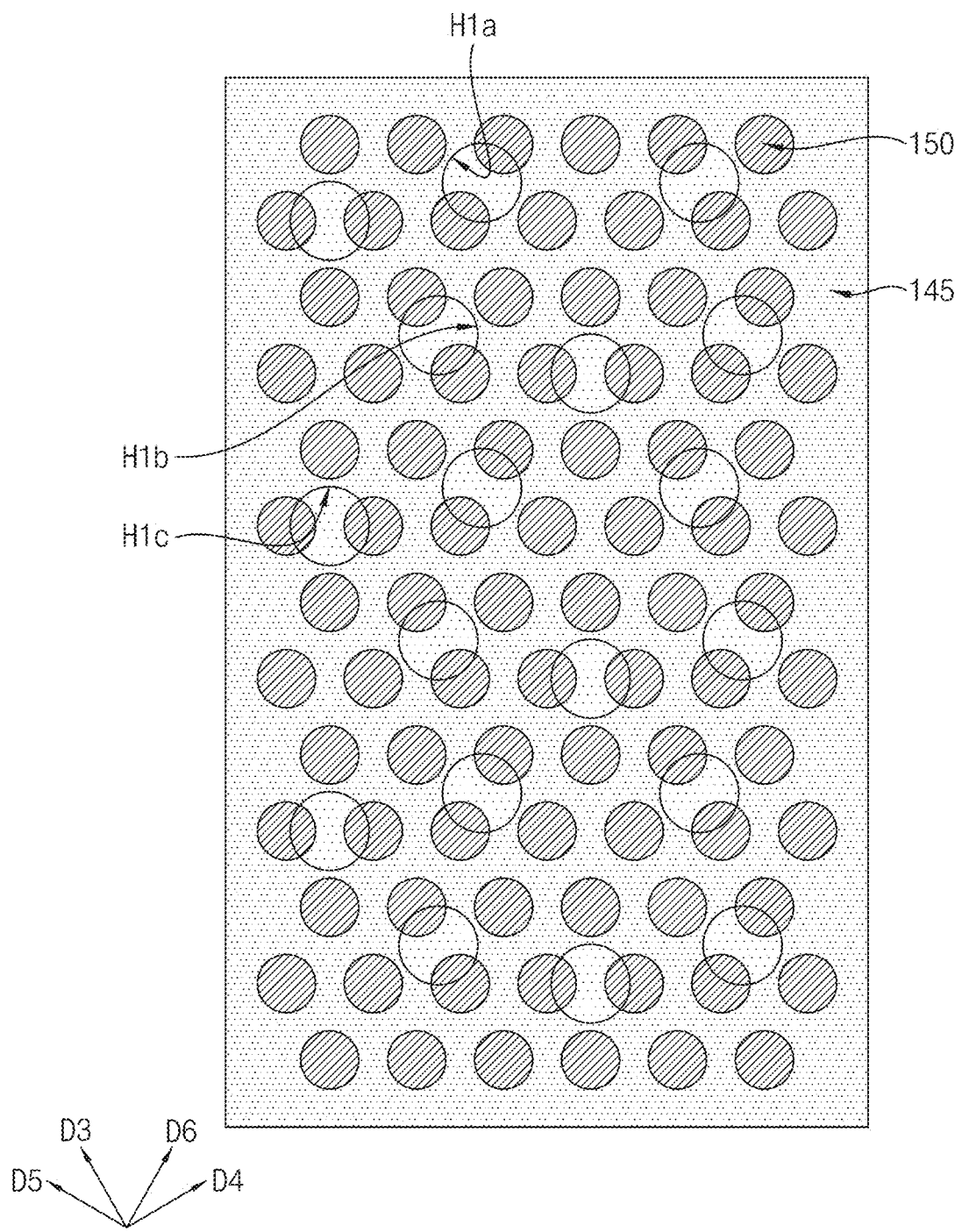
Figure 18B:
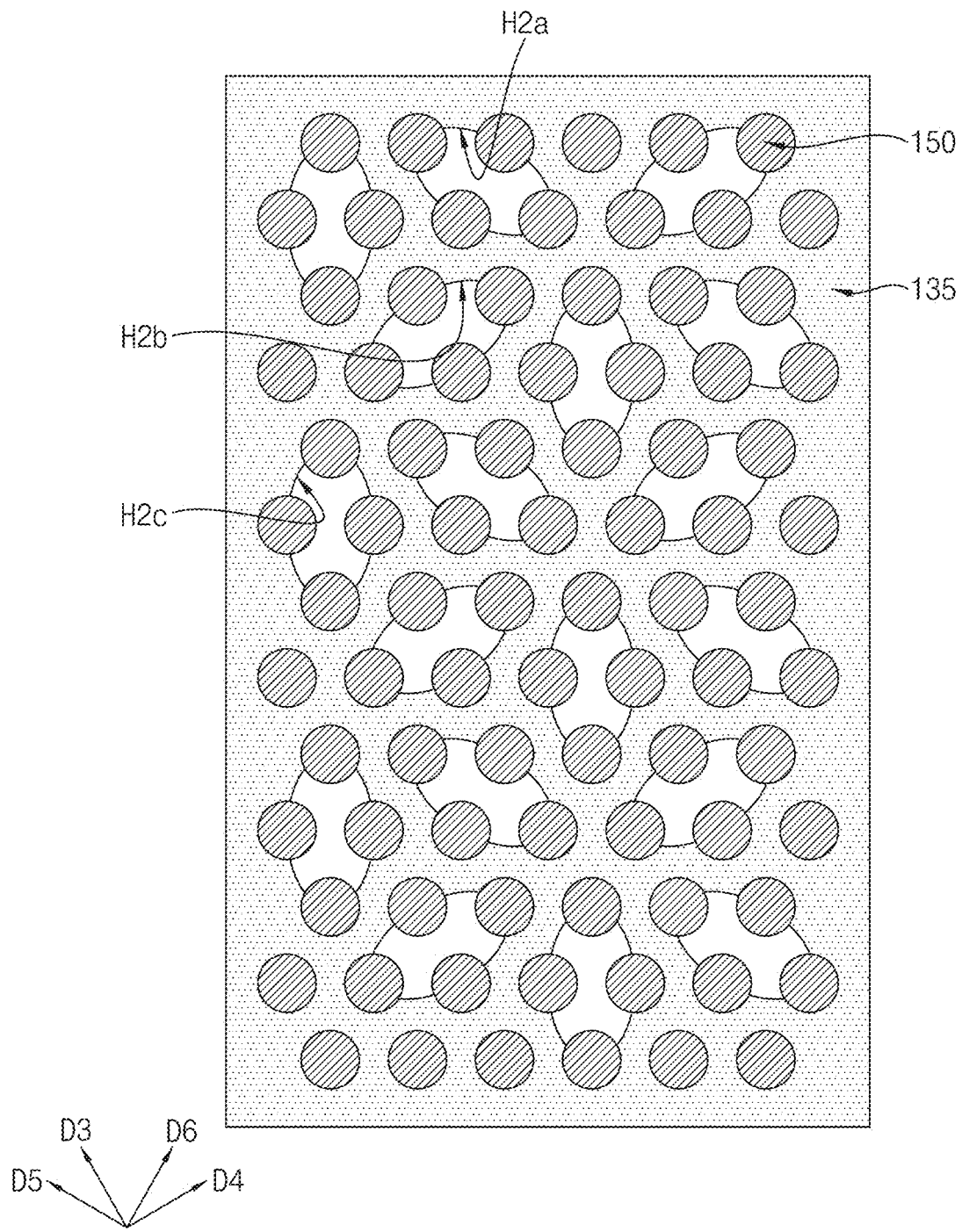

Referring to FIG. 18A, a supporter mask pattern 145 may include a plurality of first mask holes H1a, a plurality of second mask holes H1b, and a plurality of third mask holes H1c. Referring to FIG. 18B, the upper supporter pattern 135 may be formed using the supporter mask pattern 145 illustrated in FIG. 18A.

The upper supporter pattern 135 may include a plurality of first supporter holes H2a, a plurality of second supporter holes H2b, and a plurality of third supporter holes H2c. The plurality of first supporter holes H2a, the plurality of second supporter holes H2b, and the plurality of third supporter holes H2c may be respectively disposed at positions of the plurality of first mask holes H1a, the plurality of second mask holes H1b, and the plurality of third mask holes H1c. The first supporter holes H2a may have an oval shape having a major axis in the fifth direction D5 and a minor axis in the sixth direction D6. The second supporter holes H2b may have an oval shape having a minor axis in the third direction D3 and a major axis in the fourth direction D4. The third supporter holes H2c may have an oval shape having a minor axis in the first direction D1 and a major axis in the second direction D2.

The plurality of first supporter holes H2a and the plurality of second supporter holes H2b may form first columns disposed to be spaced apart from each other by a distance, e.g. a predetermined distance, in the second direction D2. For example, the first columns may have a structure in which the first supporter holes H2a and the second supporter holes H2b are alternately disposed. The first supporter holes H2a and the second supporter holes H2b adjacent to each other may be disposed to be spaced apart from each other by 1.5 F in the first direction D1 and 5.2 F in the second direction D2. The plurality of third supporter holes H2c may form second columns disposed to be spaced apart from each other by 10.2 F in the second direction D2. A distance between centers of the plurality of third supporter holes H2c may be 5.2 F. The first columns and the second columns may be alternately disposed in the first direction D1.

Figure 19:
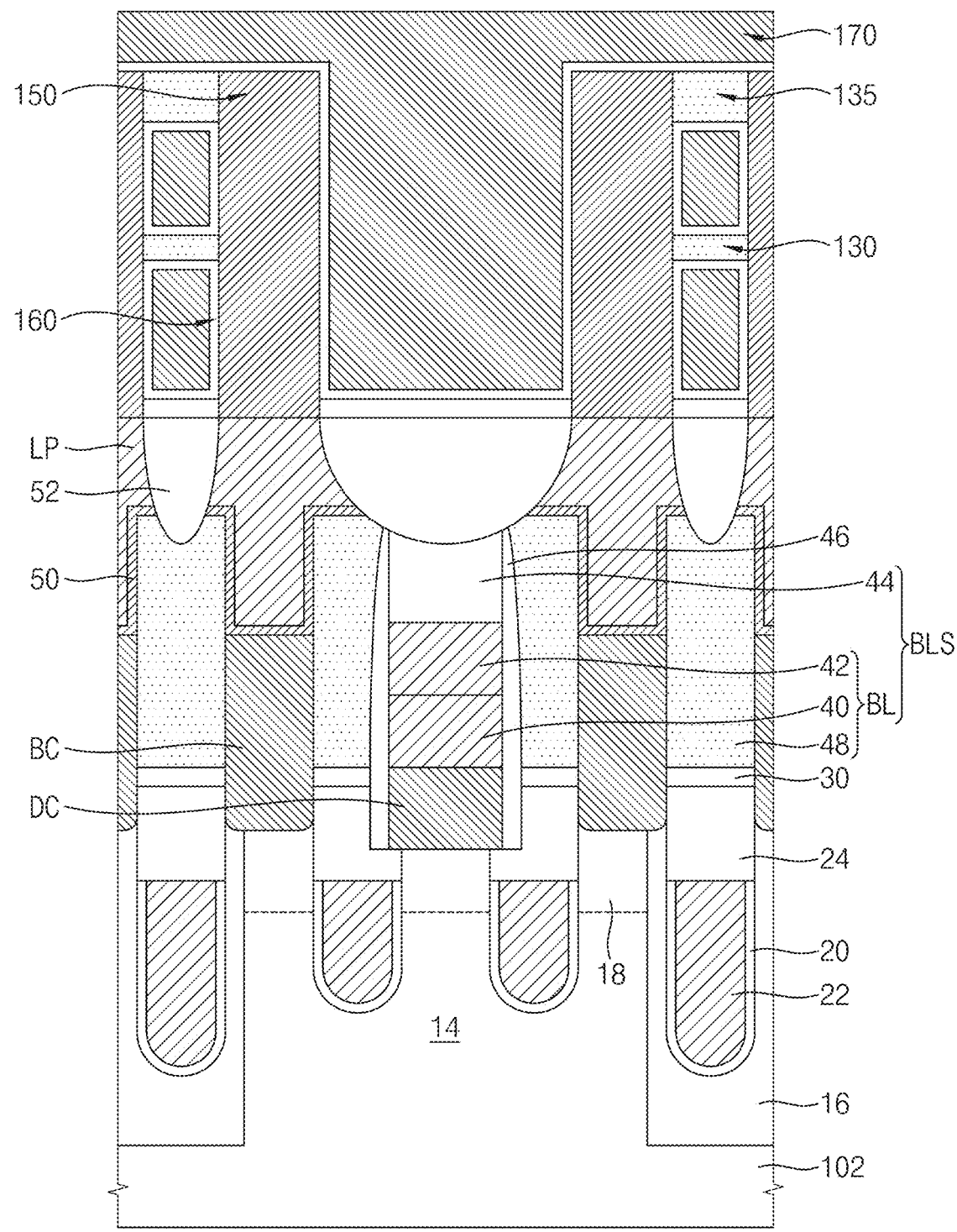
FIG. 19 is a cross-sectional view illustrating a semiconductor device according to some example embodiments of inventive concepts.

FIG. 19 is a cross-sectional view illustrating a semiconductor device according to some example embodiments of inventive concepts.

Referring to FIG. 19, the semiconductor device may include memory cells. The memory cells may include word lines, bit lines BL, and capacitors. The capacitor may include the lower electrode 150, the capacitor dielectric layer 160, and the upper electrode 170 illustrated in FIG. 2.

A substrate 102 may include an active region 14 and an element isolation layer 16. The active region 14 and the element isolation layer 16 may be disposed on the substrate 102. The element isolation layer 16 may have a shallow trench isolation (STI) structure and include an insulation material. For example, the element isolation layer 16 may include a silicon oxide. An impurity region 18 may be disposed in the active region 14. The impurity region 18 may have an n-type conductivity. The impurity region 18 may be doped with at least one of phosphorus or arsenic.

A gate insulation layer 20 and a gate electrode 22 may be disposed in the substrate 102. The gate electrode may be or may include a word line. An upper surface of the gate electrode 22 may be positioned at a level lower than an upper surface of the substrate 102. The gate electrode 22 includes a conductive material, and for example, may include doped polysilicon, a metal material, and/or a metal silicide material. The gate insulation layer 20 may be disposed to surround a side surface and a lower surface of the gate electrode 22. The gate insulation layer 20 may include an insulation material such as a silicon oxide and/or a high-k dielectric material. A gate capping layer 24 may be disposed on the gate electrode 22. The gate capping layer 24 may include a silicon nitride, a silicon oxynitride, or a combination thereof.

A first insulation pattern 30 may be disposed on the upper surface of the substrate 102. The first insulation pattern 30 may cover an upper surface of the gate capping layer 24. The first insulation pattern 30 may include a silicon oxide, a silicon nitride, a silicon oxynitride, or a combination thereof and may be formed as a single layer or multilayer.

A bit line contact plug DC may pass through the first insulation pattern 30 and may be disposed on the impurity region 18. The upper surface of the substrate 102 may be recessed such that a lower surface of the bit line contact plug DC is positioned at a level lower than the upper surface of the substrate 102. A horizontal width of the bit line contact plug DC may be greater than that of the impurity region 18, and the bit line contact plug DC may be electrically connected to the impurity region 18. The bit line contact plug DC may include a conductive material such as doped polysilicon, a metal, and/or a metal silicide.

A bit line structure BLS may include a bit line BL and a second insulation pattern 44 sequentially stacked on the bit line contact plug DC. The bit line BL may include a first conductive pattern 40 and a second conductive pattern 42 disposed on the first conductive pattern 40. The first conductive pattern 40 may include doped polysilicon, and the second conductive pattern 42 may include at least one of tungsten (W), aluminum (Al), copper (Cu), nickel (Ni), and cobalt (Co). The second insulation pattern 44 may be disposed on the second conductive pattern 42 and may include a silicon nitride and/or silicon oxynitride.

Bit line spacers 46 are formed on side surfaces of the bit line contact plug DC and the bit line structure BLS, and the bit line spacers 46 may have a pair of structures which are opposite to each other with the bit line contact plug DC and the bit line structure BLS interposed therebetween. The bit line spacers 46 may include a silicon oxide, a silicon nitride, or a silicon oxynitride, and may further include an air gap therein.

Storage node contacts BC are disposed between the bit lines and may be disposed on edges of both sides of the active region 14. The storage node contacts BC are formed to pass through the first insulation pattern 30 and may be electrically connected to the impurity region 18. Upper surfaces of the storage node contacts BC may be positioned at a level higher than an upper surface of the first insulation pattern 30. The storage node contacts BC may include doped polysilicon and/or a metal.

A third insulation pattern 48 may be disposed between the storage node contacts BC on the first insulation pattern 30. The third insulation pattern 48 may electrically insulate the storage node contacts BC from each other. An upper surface of the third insulation pattern 48 may be positioned at a level higher than the upper surfaces of the storage node contacts BC. The third insulation pattern 48 may include a silicon nitride.

A barrier pattern 50 may be disposed on the storage node contacts BC and the third insulation pattern 48, and landing pads LP may be disposed on the barrier pattern 50. The landing pads LP may be contact plugs and may be electrically connected to the lower electrodes 150. The barrier pattern 50 may protect the landing pads LP and the storage node contacts BC. The barrier pattern 50 may include TiN, Ti/TiN, TiSiN, TaN, and/or WN. The landing pads LP may include tungsten.

A fourth insulation pattern 52 may be disposed between the landing pads LP. A lower end of the fourth insulation pattern 52 may pass through the barrier pattern 50 and may be connected to the third insulation pattern 48. The fourth insulation pattern 52 may be a lower insulation layer 106. An upper surface of the fourth insulation pattern 52 may be positioned at the same level as an upper surface of the landing pad LP. The fourth insulation pattern 52 may electrically insulate the landing pads LP from each other. The fourth insulation pattern 52 may include a silicon oxide, a silicon nitride, and/or a silicon oxynitride.

Figure 20:
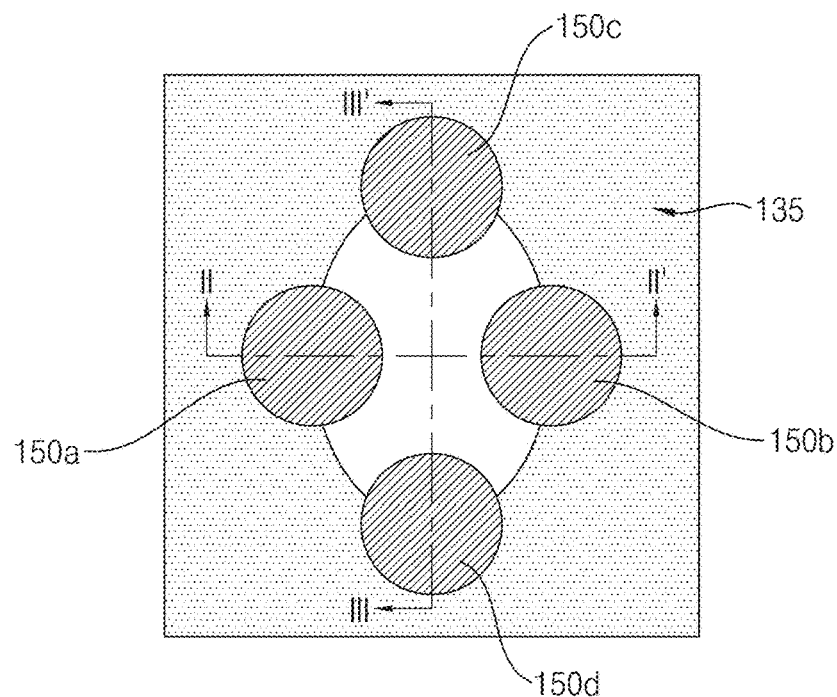
FIG. 20 is an enlarged view illustrating a part of an upper supporter pattern according to some example embodiments of inventive concepts.
Figure 21:
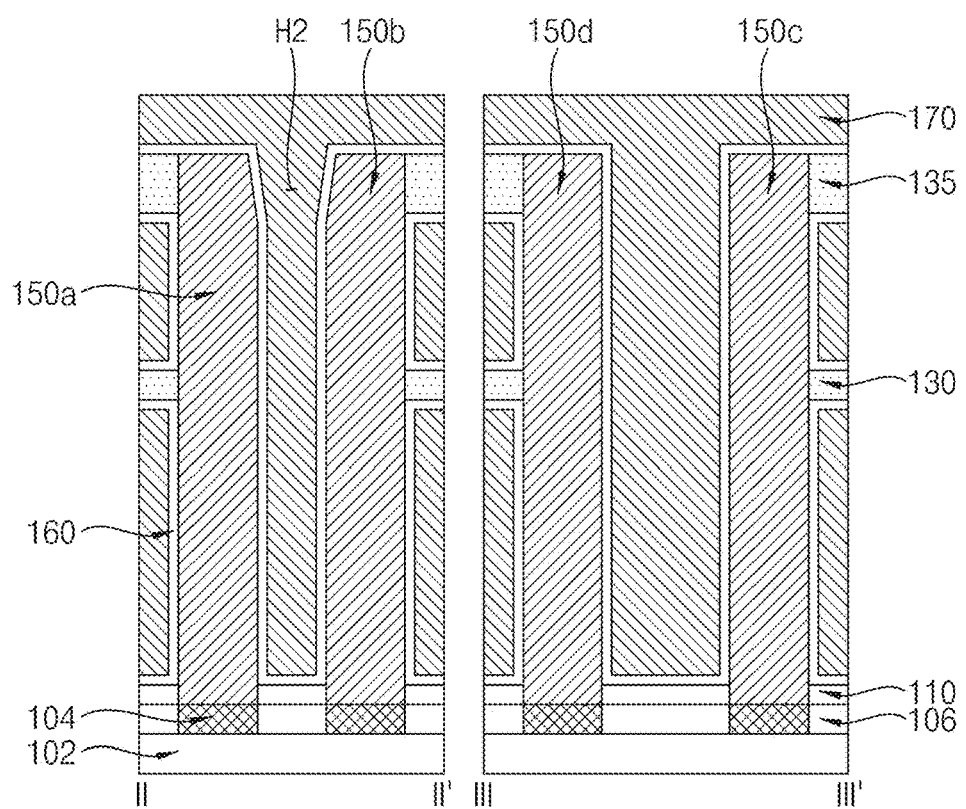
FIG. 21 shows vertical cross-sectional views illustrating a semiconductor device taken along lines II-IF and III-III' of FIG. 20.

FIG. 20 is an enlarged view illustrating a part of an upper supporter pattern according to some example embodiments of inventive concepts. FIG. 21 shows vertical cross-sectional views illustrating a semiconductor device taken along lines II-II' and III-III' of FIG. 20.

Referring to FIGS. 20 and 21, the semiconductor device may include first lower electrodes 150a, second lower electrodes 150b, third lower electrodes 150c, and fourth lower electrodes 150d. The first lower electrodes 150a may have substantially the same cross-sectional area as the second lower electrodes 150b. The third lower electrodes 150c may have substantially the same cross-sectional area as the fourth lower electrodes 150d.

Referring to FIGS. 9 and 11, supporter holes H2, the first lower electrodes 150a exposed by mask holes H1 when the supporter holes H2 are formed, and the second lower electrodes 150b may be etched first. When an etching process is performed, some of upper ends of the first lower electrodes 150a and the second lower electrodes 150b may be removed. Referring to FIG. 21 again, the first lower electrode 150a may have a cross-sectional area different from those of the third lower electrode 150c and the fourth lower electrode 150d. For example, a cross-sectional area of an upper surface of the first lower electrode 150a may be smaller than a cross-sectional area of an upper surface of the third lower electrode 150c.

Figure 22A:
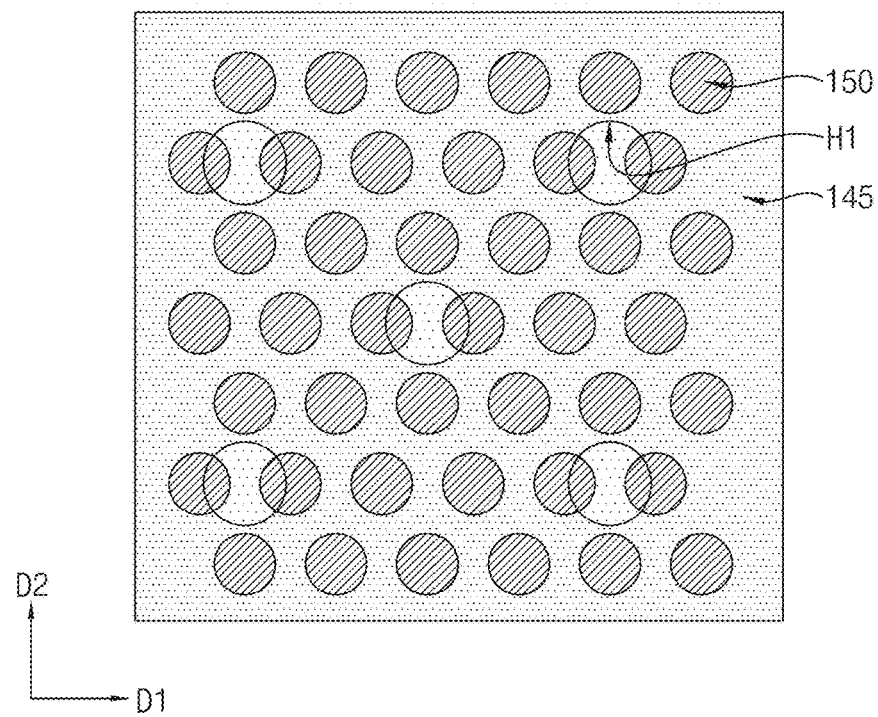
FIG. 22A is a plan view illustrating a supporter mask pattern according to some example embodiments of inventive concepts.
Figure 22B:
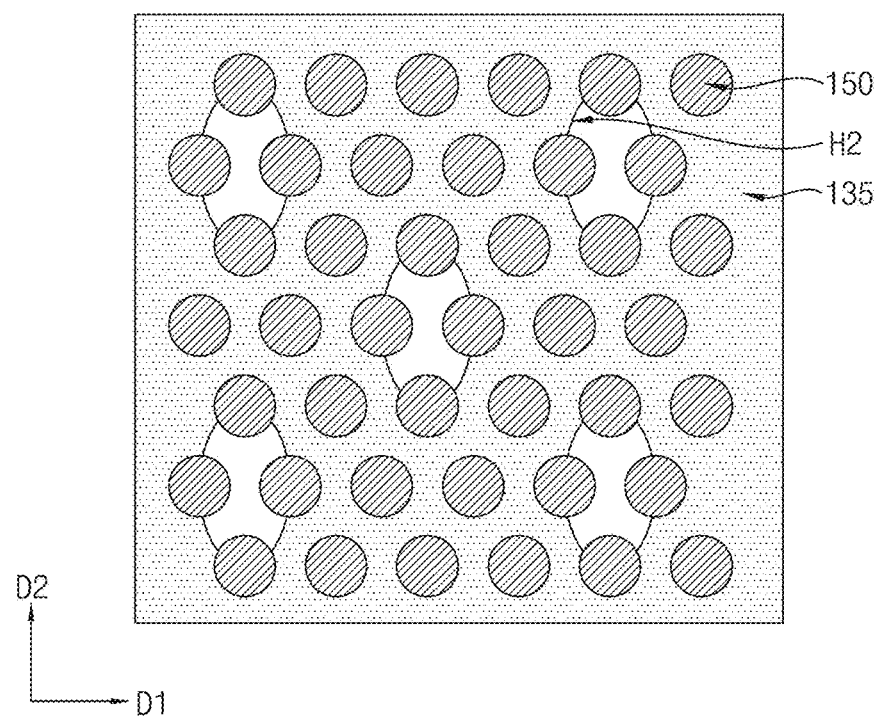
FIG. 22B is a plan view illustrating a supporter pattern according to some example embodiments of inventive concepts.

FIG. 22A is a plan view illustrating a supporter mask pattern according to some example embodiments of inventive concepts. FIG. 22B is a plan view illustrating a supporter pattern according to some example embodiments of inventive concepts.

Referring to FIGS. 22A and 22B, a supporter mask pattern 145 may include a plurality of mask holes H1. The mask holes H1 may have a circular shape and may be disposed between four adjacent lower electrodes 150. An upper supporter pattern 135 may include a plurality of supporter holes H2. The supporter holes H2 may be formed across four adjacent lower electrodes 150. Each of the supporter holes H2 may have an oval shape. Each of the supporter holes H2 may expose four lower electrodes 150, but lower electrodes 150 which are not exposed may be present among the plurality of lower electrodes 150.

According to some example embodiments, contact areas between supporter patterns and lower electrodes can be uniformly controlled.

While some example embodiments of inventive concepts have been described with reference to the accompanying drawings, it will be understood by those of ordinary skill in the art that inventive concepts may be performed in other concrete forms without changing the technological scope or essential features. The above-described embodiments should be considered in a descriptive sense only and not for purposes of limitation.

What is claimed is:

1. A semiconductor device comprising:
a substrate;
a plurality of lower electrodes disposed over the substrate, the plurality of lower electrodes including a plurality of first lower electrodes and a plurality of second lower electrodes that are respectively arranged in a first direction and alternately arranged in a second direction that is perpendicular to the first direction, each of the plurality of second lower electrodes being offset from each of the plurality of first lower electrodes with respect to the second direction;
a supporter structure contacting the plurality of lower electrodes;
a plurality of supporter holes disposed in the supporter structure and arranged in the first direction and in the second direction;
a dielectric layer disposed on the plurality of lower electrodes; and
an upper electrode disposed on the dielectric layer,
wherein one of the plurality of supporter holes exposes two of the plurality of first lower electrodes and exposes two of the plurality of second lower electrodes among the plurality of lower electrodes, and
an area of a side surface of at least one of the two of the plurality of first lower electrodes that are exposed by the one of the plurality of supporter holes is greater than an area of a side surface of at least one of the two of the plurality of second lower electrodes that are exposed by the one of the plurality of supporter holes.

2. The semiconductor device of claim 1, wherein a width of the one of the plurality of supporter holes in the first direction is less than a width of the one of the plurality of supporter holes in the second direction.

3. The semiconductor device of claim 1, wherein the plurality of supporter holes are offset from one another with respect to the first direction and with respect to the second direction.

4. The semiconductor device of claim 1, wherein each of the plurality of lower electrodes is pillar-shaped.

5. The semiconductor device of claim 1, wherein each of the plurality of lower electrodes is cylinder-shaped with a recess portion.

6. The semiconductor device of claim 1, wherein the supporter structure includes a lower supporter structure having a plurality of lower supporter holes and an upper supporter structure having a plurality of upper supporter holes, the lower supporter structure is at a lower level than the upper supporter structure with respect to a main surface of the substrate, and the plurality of lower supporter holes and the plurality of upper supporter holes overlap one another in a direction that is perpendicular to the main surface of the substrate.

7. The semiconductor device of claim 1, wherein each of the plurality of lower electrodes and the upper electrode include titanium nitride.

8. The semiconductor device of claim 1, wherein the dielectric layer includes at least one of hafnium oxide, zirconium oxide, aluminum oxide, or titanium oxide.

9. The semiconductor device of claim 1, wherein the plurality of lower electrodes are arranged in a honeycomb structure in which the plurality of lower electrodes are at centers and vertices of hexagons.

10. The semiconductor device of claim 1, wherein the plurality of first lower electrodes are arranged side by side in the first direction with the plurality of supporter holes, and the plurality of second lower electrodes are arranged side by side in the second direction with the plurality of supporter holes, and the plurality of supporter holes expose all of the plurality of first lower electrodes and the plurality of second lower electrodes.

11. The semiconductor device of claim 1, wherein minimum distances from central portions of cross-sections of the plurality of first lower electrodes to the plurality of supporter holes are less than minimum distances from central portions of cross-sections of the plurality of second lower electrodes to the plurality supporter holes.

12. The semiconductor device of claim 1, wherein the plurality of supporter holes are convex in the first direction when viewed from inner sides of the plurality of supporter holes.

13. A semiconductor device comprising:
a substrate;
a plurality of lower electrodes disposed over the substrate, the plurality of lower electrodes including a plurality of first lower electrodes and a plurality of second lower electrodes that are respectively arranged in a first direction and alternately arranged in a second direction that is perpendicular to the first direction, each of the plurality of lower electrodes is cylinder-shaped with a recess portion;
a supporter structure contacting the plurality of lower electrodes;
a plurality of supporter holes disposed in the supporter structure and arranged in the first direction and in the second direction;
a dielectric layer disposed on a side surface and on the recess portion of each of the plurality of lower electrodes; and
an upper electrode disposed on the dielectric layer and filling in the recess portion of each of the plurality of lower electrodes,
wherein each of the plurality of second lower electrodes is offset from each of the plurality of first lower electrodes with respect to the second direction,
one of the plurality of supporter holes exposes two of the plurality of first lower electrodes and exposes two of the plurality of second lower electrodes among the plurality of lower electrodes,
a width of the one of the plurality of supporter holes in the first direction is less than a width of the one of the plurality of supporter holes in the second direction,
the plurality of supporter holes are offset from one another with respect to the first direction and with respect to the second direction, and
an area of a side surface of at least one of the two of the plurality of first lower electrodes that are exposed by the one of the plurality of supporter holes is greater than an area of a side surface of at least one of the two of the plurality of second lower electrodes that are exposed by the one of the plurality of supporter holes.

14. The semiconductor device of claim 13, wherein the dielectric layer includes at least one of hafnium oxide, zirconium oxide, aluminum oxide, or titanium oxide, and
each of the plurality of lower electrodes and the upper electrode include titanium nitride.

15. The semiconductor device of claim 13, wherein minimum distances from central portions of cross-sections of the plurality of first lower electrodes to the plurality of supporter holes are less than minimum distances from central portions of cross-sections of the plurality of second lower electrodes to the plurality of supporter holes.

16. The semiconductor device of claim 13, wherein the plurality of supporter holes are convex in the first direction when viewed from inner sides of the plurality of supporter holes.

17. A semiconductor device comprising:
- a substrate;
- a plurality of lower electrodes disposed over the substrate, the plurality of lower electrodes including a plurality of first lower electrodes and a plurality of second lower electrodes that are respectively arranged in a first direction and alternately arranged in a second direction that is perpendicular to the first direction, each of the plurality of lower electrodes is pillar-shaped;
- a supporter structure contacting the plurality of lower electrodes;
- a plurality of supporter holes disposed in the supporter structure and arranged in the first direction and in the second direction;
  - a dielectric layer disposed on a side surface and on a top surface of each of the plurality of lower electrodes; and
  - an upper electrode disposed on the dielectric layer,
  - wherein each of the plurality of second lower electrodes is offset from each of the plurality of first lower electrodes with respect to the second direction,
- one of the plurality of supporter holes exposes two of the plurality of first lower electrodes and exposes two of the plurality of second lower electrodes among the plurality of lower electrodes,
  - a width of the one of the plurality of supporter holes in the first direction is less than a width of the one of the plurality of supporter holes in the second direction,
  - the plurality of supporter holes are offset from one another with respect to the first direction and with respect to the second direction, and
  - an area of a side surface of at least one of the two of the plurality of first lower electrodes that are exposed by the one of the plurality of supporter holes is greater than an area of a side surface of at least one of the two of the plurality of second lower electrodes that are exposed by the one of the plurality of supporter holes.

18. The semiconductor device of claim 17, wherein the dielectric layer includes at least one of hafnium oxide, zirconium oxide, aluminum oxide, or titanium oxide, and
each of the plurality of lower electrodes and the upper electrode include titanium nitride.

19. The semiconductor device of claim 17, wherein the plurality of supporter holes are convex in the first direction when viewed from inner sides of the plurality of supporter holes.

20. The semiconductor device of claim 17, wherein minimum distances from central portions of cross-sections of the plurality of first lower electrodes to the plurality of supporter holes are less than minimum distances from central portions of cross-sections of the plurality of second lower electrodes to the plurality of supporter holes.

* * * * *